US012635301B2

(12) United States Patent
    Choi et al.

(10) Patent No.:    US 12,635,301 B2
(45) Date of Patent:        May 19, 2026

(54) DISPLAY APPARATUS AND METHOD OF MANUFACTURING THE SAME

(71) Applicant: SAMSUNG ELECTRONICS CO., LTD., Suwon-si (KR)

(72) Inventors: Junhee Choi, Seongnam-si (KR); Kiho Kong, Suwon-si (KR); Junghun Park, Yongin-si (KR); Eunsung Lee, Seoul (KR); Nakhyun Kim, Yongin-si (KR); Joosung Kim, Seongnam-si (KR); Younghwan Park, Seongnam-si (KR); Dongchul Shin, Suwon-si (KR); Joohun Han, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 779 days.

(21) Appl. No.: 17/847,806

(22) Filed: Jun. 23, 2022

(65) Prior Publication Data

US 2023/0170440 A1     Jun. 1, 2023

(30) Foreign Application Priority Data

Nov. 30, 2021    (KR) ........................ 10-2021-0169334

(51) Int. Cl.
    *H10H 20/831*        (2025.01)
    *G06T 19/00*         (2011.01)
        (Continued)
(52) U.S. Cl.
    CPC ....... *H10H 20/8312* (2025.01); *G06T 19/006* (2013.01); *H10H 20/01* (2025.01);
        (Continued)

(58) Field of Classification Search
    CPC .... H10H 20/851; H10H 20/856; H10H 20/82; H10H 20/835; H10H 20/824; H10H 20/812; H10H 29/142; H01L 25/167
    See application file for complete search history.

(56) References Cited

U.S. PATENT DOCUMENTS 10,770,436 B2    9/2020  Yeon et al.
2004/0005723 A1  1/2004  Empedocles et al.
            (Continued)

FOREIGN PATENT DOCUMENTS

EP          3660900 A1    6/2020
EP          3813110 A1    4/2021
            (Continued)

OTHER PUBLICATIONS

Communication dated Dec. 9, 2022 issued by the European Patent Office in European Patent Application No. 22180461.0.
(Continued)

*Primary Examiner* — Monica D Harrison
*Assistant Examiner* — Moataz Khalifa
(74) *Attorney, Agent, or Firm* — Sughrue Mion, PLLC

(57)        ABSTRACT

Provided is a display apparatus including a first semiconductor layer having a first surface and a second surface opposite to each other, a plurality of partitions protruding from the first surface, and a plurality of opening areas between the plurality of partitions, a plurality of active layers provided opposite to the plurality of opening areas on the second surface of the first semiconductor layer, a plurality of second semiconductor layers respectively provided on the plurality of active layers opposite to the first semiconductor layer, a separation film provided between two adjacent active layers among the plurality of active layers and between two adjacent second semiconductor layers among the plurality of second semiconductor layers, and a (Continued)

plurality of color conversion layers provided in the plurality of opening areas on the first surface of the first semiconductor layer.

14 Claims, 33 Drawing Sheets

(51) Int. Cl.

| | | |
|---|---|---|
| *H10H 20/01* | (2025.01) | |
| *H10H 20/80* | (2025.01) | |
| *H10H 20/816* | (2025.01) | |
| *H10H 20/82* | (2025.01) | |
| *H10H 20/824* | (2025.01) | |
| *H10H 20/832* | (2025.01) | |
| *H10H 20/851* | (2025.01) | |
| *H10H 20/856* | (2025.01) | |
| *H10H 20/857* | (2025.01) | |
| *H10W 90/00* | (2026.01) | |

(52) U.S. Cl.
CPC ...... *H10H 20/8512* (2025.01); *H10H 20/857* (2025.01); *H10H 20/032* (2025.01); *H10H 20/0361* (2025.01); *H10H 20/0364* (2025.01)

(56) References Cited

U.S. PATENT DOCUMENTS

| | | | | |
|---|---|---|---|---|
| 2011/0089451 A1* | 4/2011 | Jeong | ................... | H10H 20/832 |
| | | | | 257/E33.056 |
| 2016/0141469 A1 | 5/2016 | Robin et al. | | |
| 2016/0209656 A1 | 7/2016 | Urey | | |
| 2020/0168663 A1* | 5/2020 | Choi | ................... | H10H 20/833 |
| 2020/0227592 A1 | 7/2020 | Zhang et al. | | |
| 2021/0151422 A1* | 5/2021 | Iguchi | ................... | H01L 25/167 |
| 2021/0217939 A1* | 7/2021 | Feichtinger | ......... | H10K 50/858 |
| 2021/0249466 A1 | 8/2021 | Yang et al. | | |
| 2021/0288105 A1* | 9/2021 | Kawanishi | ............... | G09G 3/32 |
| 2022/0384679 A1* | 12/2022 | Tonkikh | ............... | H10H 20/841 |

FOREIGN PATENT DOCUMENTS

| | | | |
|---|---|---|---|
| EP | | 3836212 A1 | 6/2021 |
| JP | | 2021-117249 A | 8/2021 |
| KR | 10-2020-0043794 A | | 4/2020 |
| KR | 10-2021-0048290 A | | 5/2021 |
| KR | 10-2021-0073955 A | | 6/2021 |

OTHER PUBLICATIONS

Communication dated Nov. 4, 2025, issued by the Korean Ministry of Intellectual Property in Korean Application No. 10-2021-0169334.

* cited by examiner

DISPLAY APPARATUS AND METHOD OF MANUFACTURING THE SAME

CROSS-REFERENCE TO RELATED APPLICATION

This application is based on and claims priority under 35 U.S.C. § 119 to Korean Patent Application No. 10-2021-0169334, filed on Nov. 30, 2021, in the Korean Intellectual Property Office, the disclosure of which is incorporated by reference herein in its entirety.

BACKGROUND

1. Field

Example embodiments of the present disclosure relate to a display apparatus and a method of manufacturing the same, and more particularly, to a high-resolution display apparatus using a micro light emitting diode (LED) and a method of manufacturing the same.

2. Description of Related Art

Currently, a liquid crystal display (LCD) and an organic light emitting diode (OLED) display are widely used as display apparatuses. Recently, a technology for manufacturing a high-resolution display apparatus using a micro light emitting diode (LED) has been in the spotlight. However, to manufacture a high-resolution display apparatus using micro LEDs, it is necessary to manufacture high-efficiency micro LED chips, and a high-level transfer technology is required to arrange the micro LED chips in an appropriate position.

SUMMARY

One or more example embodiments provide a method for manufacturing a display apparatus having an improved process yield.

One or more example embodiments also provide a method of manufacturing a display apparatus in which process costs are reduced by patterning a color conversion layer and a color filter without using a mask.

One or more example embodiments also provide a method of manufacturing a display apparatus in which almost no residue remains after patterning a color conversion layer and a color filter.

One or more example embodiments also provide a high-resolution display apparatus using a micro light emitting diode.

Additional aspects will be set forth in part in the description which follows and, in part, will be apparent from the description, or may be learned by practice of example embodiments of the disclosure.

According to an aspect of an example embodiment, there is provided a display apparatus including a first semiconductor layer having a first surface and a second surface opposite to each other, a plurality of partitions protruding from the first surface, and a plurality of opening areas between the plurality of partitions, a plurality of active layers provided opposite to the plurality of opening areas on the second surface of the first semiconductor layer, a plurality of second semiconductor layers respectively provided on the plurality of active layers opposite to the first semiconductor layer, a separation film provided between two adjacent active layers among the plurality of active layers and between two adjacent second semiconductor layers among the plurality of second semiconductor layers, a plurality of color conversion layers provided in the plurality of opening areas on the first surface of the first semiconductor layer, a light blocking film provided on sidewalls of the plurality of partitions, and a driving circuit configured to independently drive the plurality of active layers.

A material of the plurality of partitions may be same as a material of the first semiconductor layer, and the plurality of partitions may integrally extend from the first surface of the first semiconductor layer.

The display apparatus may further include a common electrode provided on a surface of the plurality of partitions.

The common electrode may include an opaque metal material.

The display apparatus may further include a support substrate and a driving circuit layer provided between the support substrate and the plurality of second semiconductor layers and between the support substrate and the separation film, wherein the driving circuit layer may include the driving circuit.

The first surface of the first semiconductor layer in the plurality of opening areas may have a light extraction pattern.

The display apparatus may further include a plurality of reflective electrodes electrically connected to the plurality of second semiconductor layers, respectively.

The first semiconductor layer may be doped with a first conductivity type, and the plurality of second semiconductor layers may be doped with a second conductivity type electrically opposite to the first conductivity type.

An interval between two adjacent partitions, among the plurality of partitions, may be greater than a width of each of the plurality of active layers.

The width of each of the plurality of active layers may be in a range of 0.1 μm to 100 μm.

A height of each of the plurality of color conversion layers may be less than a height of each of the plurality of partitions.

Each of the plurality of color conversion layers may include a photoresist and quantum dots or phosphors dispersed in the photoresist.

The display apparatus may further include an insulating layer provided on the plurality of partitions and the plurality of color conversion layers, the insulating layer having transparency to light emitted from the plurality of color conversion layers.

In at least one opening area of the plurality of opening areas, a color conversion layer may not be provided and the insulating layer may be filled.

The display apparatus may further include a plurality of absorption type color filters respectively provided on the plurality of color conversion layers.

Each of the plurality of absorption type color filters may be provided in direct contact with an upper surface of a corresponding one of the plurality of color conversion layers.

According to another aspect of an example embodiment, there is provided an augmented reality device including a projection system including a display apparatus configured to form an image, and an optical system configured to guide the image from the projection system to a user's eyes, wherein the display apparatus includes a first semiconductor layer having a first surface and a second surface opposite to each other, a plurality of partitions protruding from the first surface, and a plurality of opening areas between the plurality of partitions, a plurality of active layers provided opposite to the plurality of opening areas on the second surface of the first semiconductor layer, a plurality of second semiconductor layers respectively provided on a surface of the plurality of active layers opposite to the first semiconductor layer, a separation film provided between two adjacent active layers and between two adjacent second semiconductor layers, a plurality of color conversion layers provided in the plurality of opening areas on the first surface of the first semiconductor layer, a light blocking film provided on sidewalls of the plurality of partitions, and a driving circuit configured to independently drive the plurality of active layers.

According to yet another aspect of an example embodiment, there is provided a method of manufacturing a display apparatus, the method including forming a first semiconductor layer, an active layer, and a second semiconductor layer on a growth substrate, forming a separation film that separates the second semiconductor layer and the active layer into a plurality of second semiconductor layers and a plurality of active layers, forming a driving circuit layer on the separation film and the plurality of second semiconductor layers, bonding a support substrate to the driving circuit layer, removing the growth substrate, forming a patterned common electrode on a surface of the first semiconductor layer exposed by removing the growth substrate, forming a plurality of partitions by etching the first semiconductor layer between the patterned common electrode, forming a light blocking film on sidewalls of the plurality of partitions, and forming a plurality of color conversion layers in a plurality of opening areas formed between the plurality of partitions, wherein the plurality of partitions are formed such that the plurality of active layers are opposite to the plurality of opening areas.

The forming of the plurality of partitions may include forming a plurality of partitions through dry etching such that the sidewalls of the plurality of partitions are inclined sidewalls, increasing an inclination angle of the inclined sidewalls of the plurality of partitions through wet etching.

The method may further include forming a light extraction pattern on the surface of the first semiconductor layer in the plurality of opening areas formed between the plurality of partitions while performing the wet etching.

The forming of the plurality of color conversion layers may include forming a color conversion layer material including photoresist and quantum dots or phosphor dispersed in the photoresist on the plurality of partitions and the plurality of opening areas formed between the plurality of partitions, curing a portion of the color conversion layer material by emitting light to the color conversion layer material based on operating at least one of the plurality of active layers, and removing a portion of the color conversion layer material that is not cured.

An interval between two adjacent partitions may be greater than a width of each of the plurality of active layers.

The width of each of the plurality of active layers may be in a range of 0.1 μm to 100 μm.

A height of each of the plurality of color conversion layers may be less than a height of each of the plurality of partitions.

The method may further include forming a plurality of absorption type color filters respectively on the plurality of color conversion layers.

The forming of the plurality of absorption type color filters may include forming a color filter material including a photoresist and a dye or pigment dispersed in the photoresist on the plurality of partitions and the plurality of color conversion layers formed between the plurality of partitions, curing a portion of the color filter material based on operating at least one of the plurality of active layers to emit the color filter material with light, and removing an uncured portion of the color filter material.

Each of the plurality of absorption type color filters may be provided in direct contact with an upper surface of a corresponding one of the plurality of color conversion layers.

The method may further include forming an insulating layer having transparency to light emitted from the plurality of color conversion layers on the plurality of partitions and the plurality of color conversion layers formed between the plurality of partitions.

In at least one opening area of the plurality of opening areas, a color conversion layer may be not provided and the insulating layer may be filled.

The patterned common electrode may include an opaque metal material.

The method may further include forming a plurality of reflective electrodes electrically connected to the plurality of second semiconductor layers before removing the growth substrate.

According to yet another aspect of an example embodiment, there is provided a display apparatus including a first semiconductor layer having a first surface and a second surface opposite to each other, a plurality of partitions protruding from the first surface, and a plurality of opening areas between the plurality of partitions, a plurality of active layers provided opposite to the plurality of opening areas on the second surface of the first semiconductor layer, a plurality of second semiconductor layers respectively provided on the plurality of active layers opposite to the first semiconductor layer, a separation film provided between two adjacent active layers among the plurality of active layers and between two adjacent second semiconductor layers among the plurality of second semiconductor layers, a plurality of color conversion layers provided in the plurality of opening areas on the first surface of the first semiconductor layer, a common electrode provided on a surface of the plurality of partitions, a light blocking film provided on sidewalls of the plurality of partitions, and a driving circuit configured to independently drive the plurality of active layers, wherein the plurality of partitions integrally extend from the first surface of the first semiconductor layer.

BRIEF DESCRIPTION OF THE DRAWINGS

The above and/or other aspects, features, and advantages of example embodiments will be more apparent from the following description taken in conjunction with the accompanying drawings, in which.

DETAILED DESCRIPTION

Figure 1:
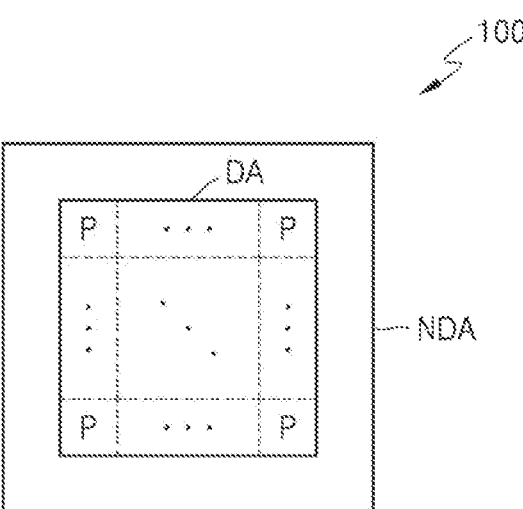
FIG. 1 is a conceptual diagram of a display apparatus according to an example embodiment.

Reference will now be made in detail to embodiments, examples of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects.

As used herein, the term "and/or" comprises any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Hereinafter, a display apparatus and a method of manufacturing the same will be described in detail with reference to the accompanying drawings. In the following drawings, the same reference numerals refer to the same components, and the size of each component in the drawings may be exaggerated for clarity and convenience of description. Further, the embodiments described below are merely exemplary, and various modifications are possible from these embodiments.

Hereinafter, what is described as "upper part" or "on" may comprise not only those directly above by contact, but also those above non-contact. The terms of a singular form may comprise plural forms unless otherwise specified. In addition, when a certain part "includes" a certain component, it means that other components may be further comprised rather than excluding other components unless otherwise stated.

The use of the term "the" and similar designating terms may correspond to both the singular and the plural. If there is no explicit order or contradictory statement about the steps constituting the method, these steps may be performed in an appropriate order, and are not necessarily limited to the order described.

In addition, terms such as "unit" and "module" described in the specification mean a unit that processes at least one function or operation, and this may be implemented as hardware or software, or may be implemented as a combination of hardware and software.

The connection or connection members of lines between the components shown in the drawings are illustrative of functional connections and/or physical or circuit connections, and may be represented as a variety of functional connections, physical connections, or circuit connections that are replaceable or additional in an actual device.

The use of all examples or illustrative terms is merely for describing technical ideas in detail, and the scope is not limited by these examples or illustrative terms unless limited by the claims.

Figure 2:
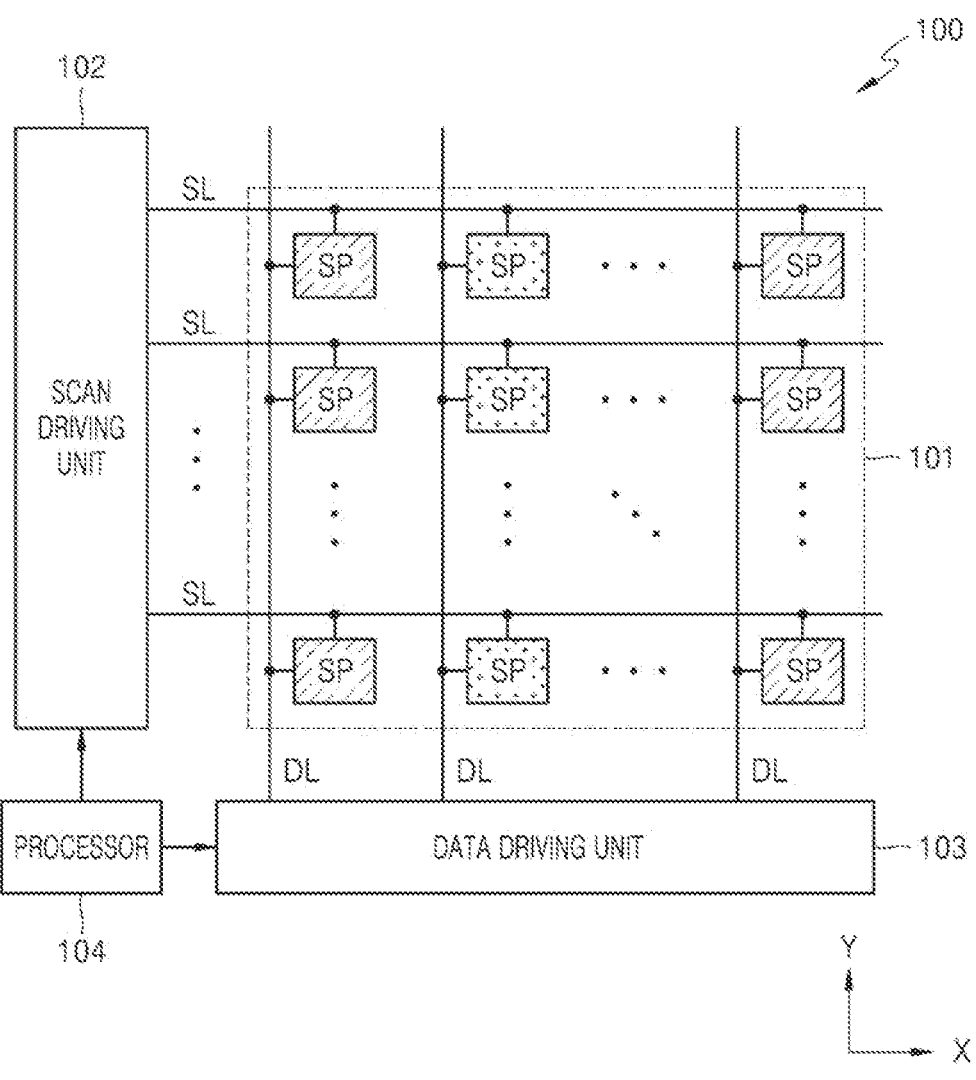
FIG. 2 is a circuit diagram of a display apparatus according to an example embodiment.

FIG. 1 is a conceptual diagram of a display apparatus according to an example embodiment, and FIG. 2 is a circuit diagram of a display apparatus according to an example embodiment. Referring to FIGS. 1 and 2, a display apparatus 100 may be divided into a display area DA and a non-display area NDA. The display area DA is an area for displaying an image. The display area DA may comprise a plurality of pixels P for displaying an image. The plurality of pixels P may be arranged in the form of a two-dimensional array in the display area DA. Each of the pixels P may comprise sub-pixels SP emitting different colors.

In addition, the display apparatus 100 may comprise a pixel array 101, a scan driving unit 102, a data driving unit 103, and a processor 104. The pixel array 101 may be disposed in the display area DA of the display apparatus 100. According to another example embodiment, the scan driving unit 102, the data driving unit 103, and the processor 104 may be disposed in the non-display area NDA of the display apparatus 100.

The pixel array 101 may comprise a plurality of pixels P or a plurality of sub-pixels (SP) arranged in a two-dimensional array, a plurality of scan lines SL for transmitting a scan signal to the plurality of pixels P or sub-pixels SP, and a plurality of data lines DL for transmitting data signals to the plurality of pixels P or sub-pixels SP. The plurality of scan lines SL extend toward the scan driving unit 102 to receive a scan signal from the scan driving unit 102, and the plurality of data lines DL extend toward the data driving unit 103 to receive a data signal from the data driving unit 103.

The plurality of scan lines SL and the plurality of data lines DL extend in a direction crossing each other. FIG. 2 illustrates that the plurality of scan lines SL extend in the X direction and the plurality of data lines DL extend in the Y direction, but embodiments are not limited thereto, and the extension directions of the plurality of data lines DL and the plurality of scan lines SL may be interchanged. The sub-pixels SP may be respectively disposed at positions where the plurality of scan lines SL and the plurality of data lines DL intersect.

Each of the plurality of sub-pixels SP may comprise a light emitting element and a driving transistor for driving the light emitting element. Therefore, the display apparatus 100 may comprise a plurality of light emitting elements and a plurality of driving transistors. The scan driving unit 102, the data driving unit 103, the processor 104 and the plurality of driving transistors may form a driving circuit for driving the pixel array 101. The driving circuit may be configured to independently drive the plurality of light emitting elements.

The light emitting element may be a micro light emitting element having a micro-scale size. For example, the light emitting element may have a size in the range of about 0.1 μm to about 100 μm. According to an example embodiment, the plurality of light emitting elements and the driving circuit comprising the scan driving unit 102, the data driving unit 103, the processor 104 and the plurality of driving transistors may be formed together on one growth substrate.

FIGS. 3 to 19 are cross-sectional views illustrating an example manufacturing process of a display apparatus according to an example embodiment.

Figure 3:
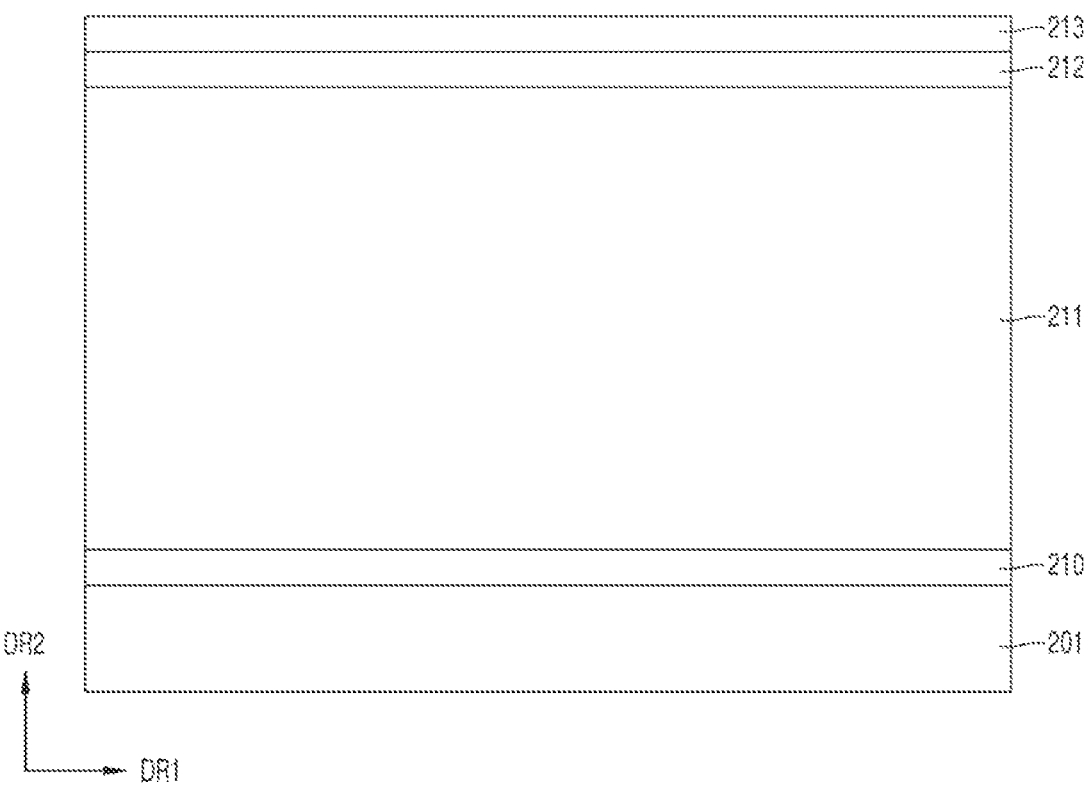
FIGS. 3 to 19 are cross-sectional views illustrating an example manufacturing process of a display apparatus according to an example embodiment.

First, referring to FIG. 3, a first buffer layer 210 may be formed on a growth substrate 201. The growth substrate 201 may comprise, for example, silicon, sapphire, or gallium arsenide (GaAs). The first buffer layer 210, for example, may be grown to have a crystal structure using a chemical vapor deposition (CVD) process, a physical vapor deposition (PVD) process, or an atomic layer deposition (ALD) process. The first buffer layer 210 is to relieve stress caused by a difference in lattice constant between the growth substrate 201 and a first semiconductor layer 211 to be described later. To this end, the lattice constant of the first buffer layer 210 may have a value between the lattice constant of the growth substrate 201 and the lattice constant of the first semiconductor layer 211, or may have the same value as the lattice constant of the first semiconductor layer 211. The first buffer layer 210 may comprise, for example, a group III-V compound semiconductor such as gallium nitride (GaN), gallium phosphide (GaP), or GaAs. Also, the first buffer layer 210 may be doped with the same conductivity type as that of the first semiconductor layer 211. For example, when the first semiconductor layer 211 is n-type doped, the first buffer layer 210 may comprise n-GaN, n-GaP, or n-GaAs, and when the first semiconductor layer 211 is doped with p-type, the first buffer layer 210 may comprise p-GaN, p-GaP, or p-GaAs.

A first semiconductor layer 211, an active layer 212, and a second semiconductor layer 213 may be sequentially formed on the first buffer layer 210. The first semiconductor layer 211 may be doped with a first conductivity type, and the second semiconductor layer 213 may be doped with a second conductivity type that is electrically opposite to the first conductivity type. For example, the first semiconductor layer 211 may be doped with n-type and the second semiconductor layer 213 may be doped with p-type, or the first semiconductor layer 211 may be doped with p-type and the second semiconductor layer 213 may be doped with n-type. The active layer 212 is not doped. The first semiconductor layer 211, the active layer 212, and the second semiconductor layer 213 may comprise, for example, a group III-V compound semiconductor such as GaN, indium gallium nitride (InGaN), aluminum gallium indium nitride (Al-GaInN), or aluminum gallium indium phosphide (AlGaInP).

The active layer 212 generates light by recombination of electrons and holes provided from the first semiconductor layer 211 and the second semiconductor layer 213. To this end, the active layer 212 has a quantum well structure in which quantum wells are disposed between barriers. The wavelength of light generated in the active layer 212 may be determined according to an energy bandgap of a material forming the quantum well in the active layer 212. The active layer 212 may have only one quantum well, or may have a multi-quantum well (MQW) structure in which a plurality of quantum wells and a plurality of barriers are alternately arranged. The energy of the quantum well in the conduction band may be chosen to be lower than the energy of the barrier by the barrier and the quantum well in the active layer 212 may comprising different compound semiconductors or compound semiconductors having different compositions.

Figure 4:
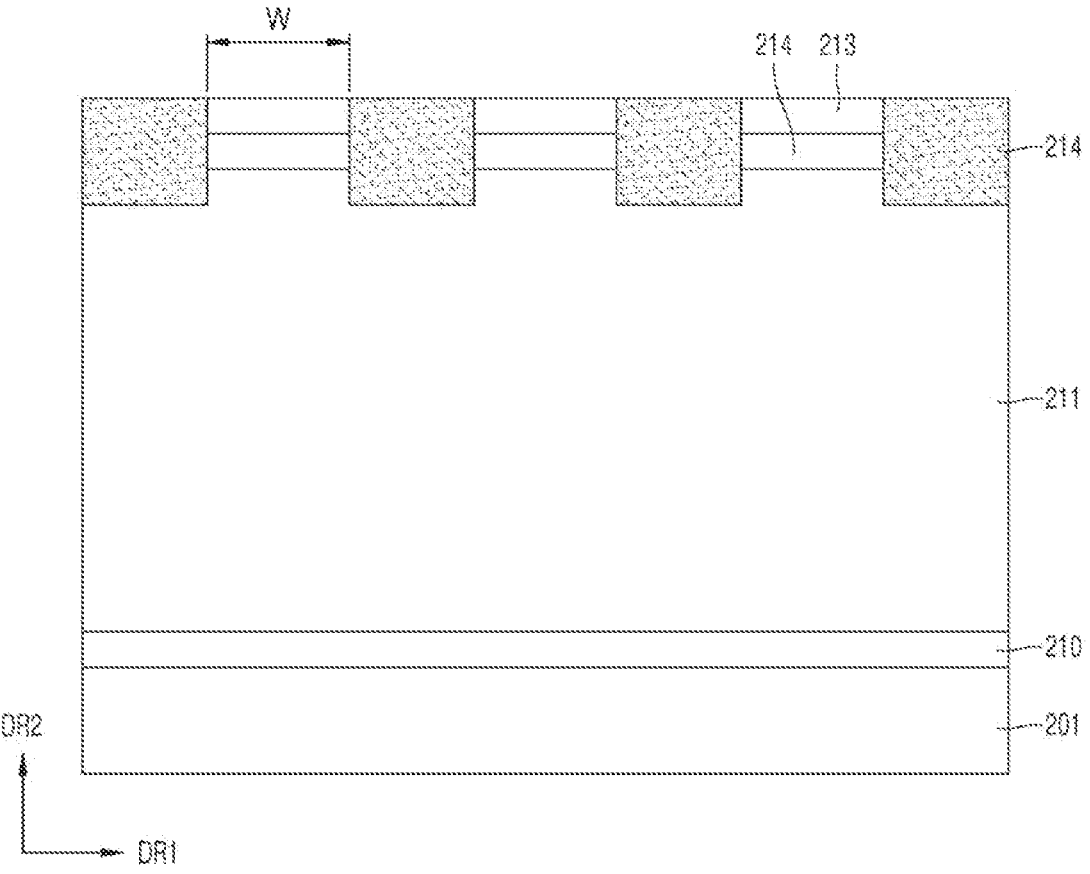

Referring to FIG. 4, a separation film 214 separating the second semiconductor layer 213 and the active layer 212 into a plurality of second semiconductor layers 213 and a plurality of active layers 212, respectively, may be formed. The separation film 214 may be formed by, for example, implanting impurities into the second semiconductor layer 213 and the active layer 212 through an ion implantation process. For example, the impurity may comprise element argon (Ar). The separation film 214 formed in the above manner may have electrical insulation properties. In the cross-sectional view of FIG. 4, the plurality of separation films 214 appear to be arranged at regular intervals along the first direction DR1 parallel to the upper surface of the growth substrate 201, but the separation film 214 may actually be one layer having a mesh shape, and the plurality of active layers 212 and the plurality of second semiconductor layers 213 may have a two-dimensional arrangement. The plurality of second semiconductor layers 213 may be electrically isolated from each other by the separation film 214, and the plurality of active layers 212 may be electrically isolated from each other by the separation film 214. To ensure reliable electrical separation between the plurality of active layers 212, the separation film 214 may extend to a portion of the first semiconductor layer 211. For example, the thickness of the separation film 214 may be equal to or greater than the sum of the thickness of the active layer 212 and the thickness of the second semiconductor layer 213.

The plurality of second semiconductor layers 213 and the plurality of active layers 212 may form a plurality of light emitting elements together with the first semiconductor layer 211. The plurality of light emitting elements may be, for example, micro light emitting elements having a micro-scale size, in particular, micro light emitting diodes (LEDs). For example, the spacing between two adjacent separation films 214 along the first direction DR1, or the width W of each of the plurality of active layers 212 in the first direction DR1, or the width W of each of the plurality of second semiconductor layers 213 in the first direction DR1 may be in a range of about 0.1 μm to about 100 μm.

Figure 5:
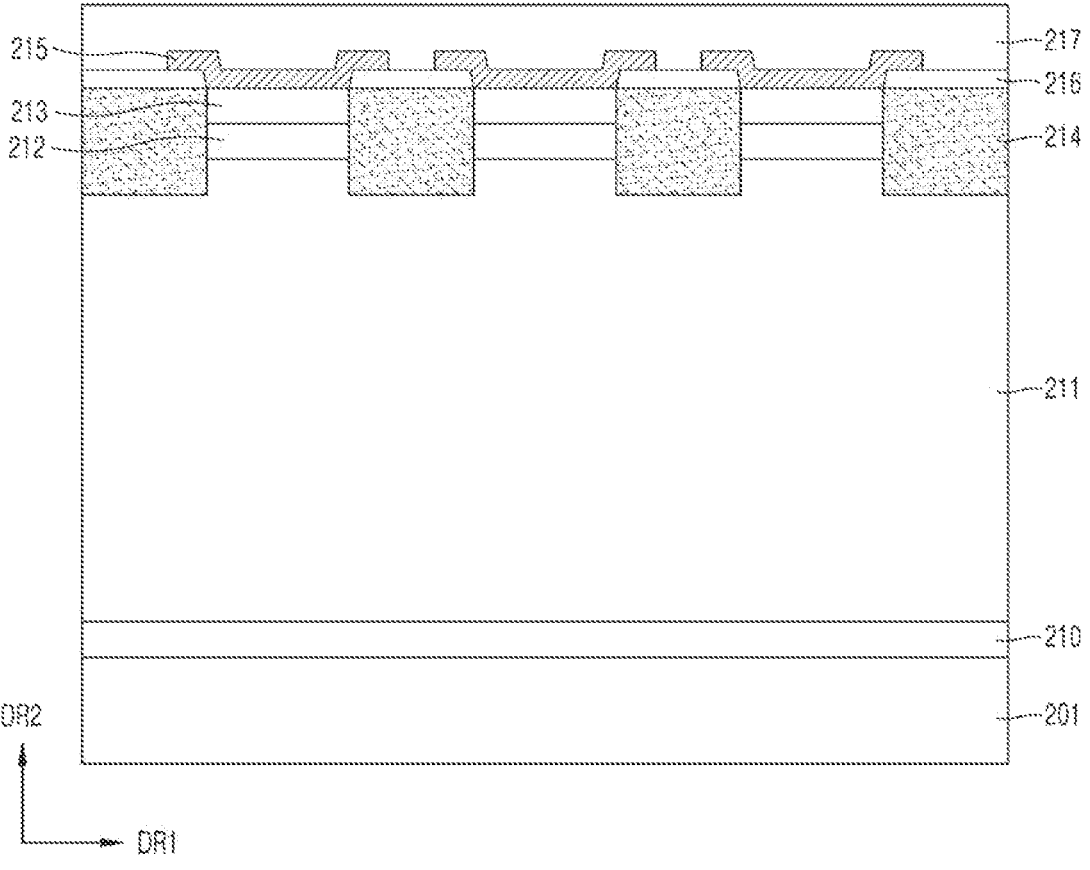

Referring to FIG. 5, a passivation layer 216 may be formed on the separation film 214. For example, after forming the passivation layer material to cover both the plurality of second semiconductor layers 213 and the separation film 214, the passivation layer 216 may be formed by exposing the plurality of second semiconductor layers 213 to the outside through a patterning process. The passivation layer 216 may comprise an insulating material. For example, the passivation layer 216 may comprise silicon oxide ($SiO_2$), aluminum oxide ($Al_2O_3$), silicon nitride (SiN), aluminum nitride (AlN), or a combination thereof.

Then, a plurality of reflective electrodes 215 may be respectively formed on the plurality of second semiconductor layers 213. For example, after forming a reflective electrode material to cover both the plurality of second semiconductor layers 213 and the passivation layer 216, the plurality of reflective electrodes 215 may be formed by exposing the passivation layer 216 to the outside through a patterning process. Each reflective electrode 215 may further extend over a portion of the upper surface of the passivation layer 216. The reflective electrode 215 may comprise a metal material having reflectivity with respect to light generated from the active layer 212. For example, the reflective electrode 215 may comprise at least one of silver (Ag), aluminum (Al), indium (In), titanium (Ti), nickel (Ni), copper (Cu), chromium (Cr), gold (Au), palladium (Pd), tungsten (W), and platinum (Pt), or an alloy thereof. The reflective electrode 215 may be electrically connected to a corresponding second semiconductor layer among the plurality of second semiconductor layers 213. A contact layer for providing an ohmic contact may be further disposed between the reflective electrode 215 and the second semiconductor layer 213 corresponding to each other.

In addition, a first insulating layer 217 may be formed on the plurality of reflective electrodes 215 and the passivation layer 216. The first insulating layer 217 may be formed through, for example, a CVD process, a PVD process, or an ALD process. The first insulating layer 217 may extend in the first direction DR1. The first insulating layer 217 may completely cover the plurality of reflective electrodes 215 and the passivation layer 216. The first insulating layer 217 may comprise, for example, $SiO_2$, $Al_2O_3$, SiN, AlN, or a combination thereof.

Figure 6:
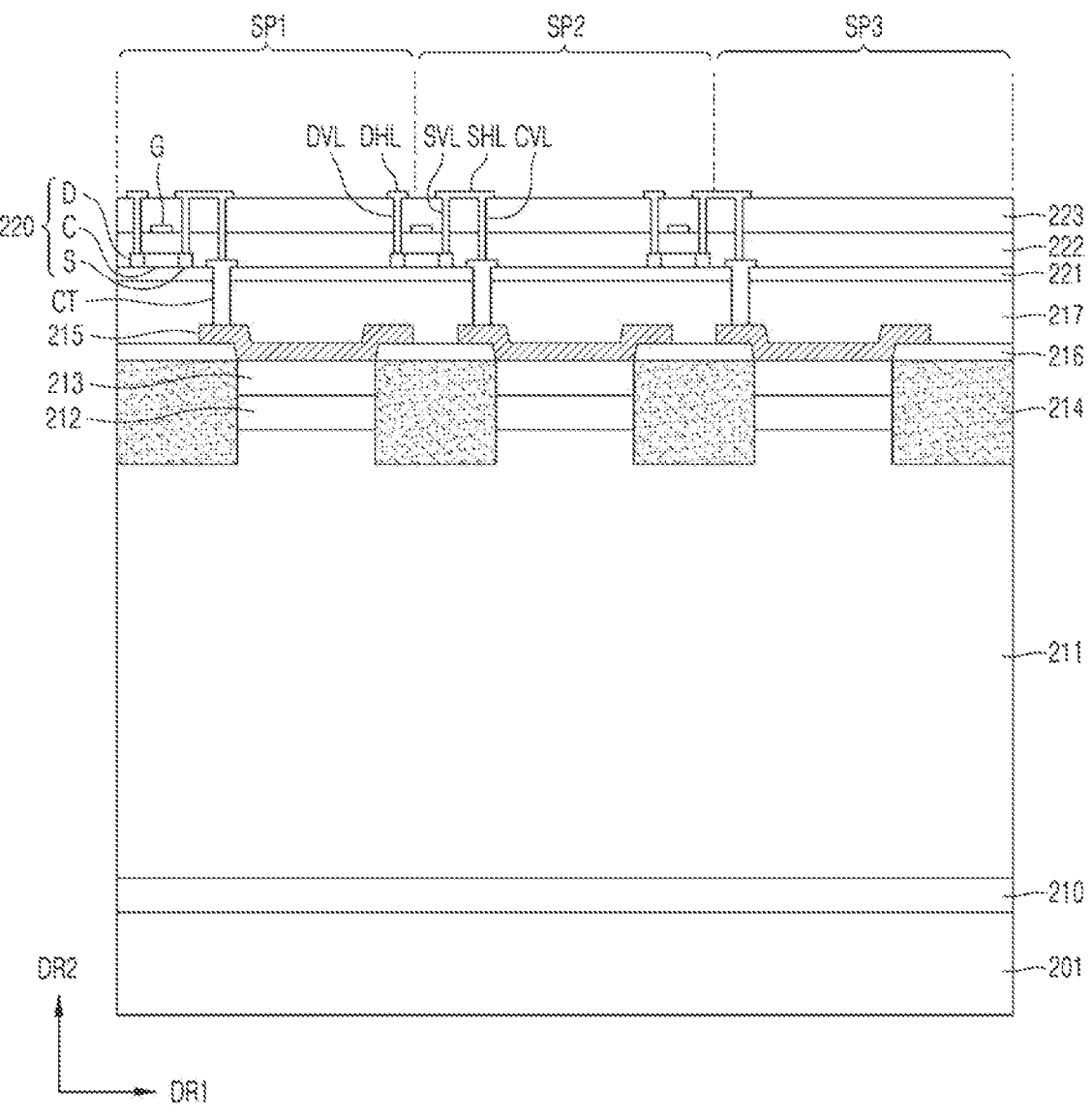

Referring to FIG. 6, a second buffer layer 221 may be formed on the first insulating layer 217. The second buffer layer 221 may be formed through, for example, a CVD process, a PVD process, or an ALD process. The second buffer layer 221 may comprise an insulating material. For example, the second buffer layer 221 may comprise $SiO_2$, $Al_2O_3$, SiN, AlN, or a combination thereof. The second buffer layer 221 may serve as a growth substrate for forming a semiconductor pattern 220 to be described later.

In addition, contacts CT passing through the second buffer layer 221 and the first insulating layer 217 may be formed. The contacts CT may be electrically connected to the reflective electrodes 215, respectively. For example, the contacts CT may directly contact the corresponding reflective electrodes 215, respectively. After openings for respectively exposing the reflective electrodes 215 through the second buffer layer 221 and the first insulating layer 217 are formed, the contacts CT may be formed by filling the openings with a conductive material. Although the drawing shows the conductive material completely filling the openings, embodiments are not limited thereto. In another example, a portion of the conductive material extends along the surfaces of the second buffer layer 221 and the first insulating layer 217 exposed by the openings, and may not completely fill the openings. Upper portions of the contacts CT may be exposed on the second buffer layer 221.

Semiconductor patterns 220 may be formed on the second buffer layer 221. Each of the semiconductor patterns 220 may comprise a source region S, a drain region D, and a channel region C. By forming amorphous semiconductor patterns on the second buffer layer 221 and emitting lasers to both ends of the amorphous semiconductor patterns to crystallize, the semiconductor patterns 220 may be formed. For example, the amorphous semiconductor patterns may comprise amorphous silicon. Both crystallized ends of the semiconductor pattern 220 may be defined as the source region S and the drain region D. A portion between both ends of each of the semiconductor patterns 220 may be amorphous. The amorphous portion of the semiconductor pattern 220 may be defined as the channel region C. The semiconductor patterns 220 may be respectively provided on the corresponding separation films 214. For example, each of the semiconductor patterns 220 may overlap the corresponding separation film 214 along the second direction DR2 perpendicular to the upper surface of the growth substrate 201 and may be disposed so as not to obscure the active layer 212.

A second insulating layer 222 may be formed on the semiconductor patterns 220, the second buffer layer 221, and the contacts CT. The second insulating layer 222 may be formed through, for example, a CVD process, a PVD process, or an ALD process. The second insulating layer 222 may extend in the first direction DR1. The second insulating layer 222 may comprise $SiO_2$, $Al_2O_3$, SiN, AlN, or a combination thereof. The second insulating layer 222 may function as a gate insulating film.

In addition, gate electrodes G may be formed on the second insulating layer 222. The gate electrodes G may be formed by forming a gate electrode film extending along the second insulating layer 222 and patterning the gate electrode film. The gate electrode film may be formed, for example, by performing a CVD process, a PVD process, or an ALD process. The gate electrode film may comprise, for example, a conductive material such as metal or polysilicon. The gate electrodes G may be provided on opposite sides of the channel regions C with respect to the second insulating layer 222, respectively. In other words, the gate electrodes G may be disposed to overlap the channel regions C along the second direction DR2.

A third insulating layer 223 may be formed on the gate electrodes G and the second insulating layer 222. The third insulating layer 223 may be formed through, for example, a CVD process, a PVD process, or an ALD process. The third insulating layer 223 may extend in the first direction DR1. The third insulating layer 223 may comprise $SiO_2$, $Al_2O_3$, SiN, AlN, or a combination thereof.

Then, drain vertical lines DVL passing through the second insulating layer 222 and the third insulating layer 223 may be formed. The drain vertical lines DVL may comprise, for example, a conductive material such as a metal. The drain vertical lines DVL may be formed by passing through the second insulating layer 222 and the third insulating layer 223 to form openings exposing the drain regions D, respectively, and providing a conductive material in the openings. Although the drawing shows that the conductive material provided in the openings completely fills the openings, embodiments are not limited thereto. In another example, the conductive material extends along the surfaces of the second insulating layer 222 and the third insulating layer 223 exposed by the openings, and may not completely fill the openings. The drain vertical lines DVL may be electrically connected to the drain regions D, respectively. For example, each of the drain vertical lines DVL may directly contact a corresponding drain region D, respectively.

Drain horizontal lines DHL may be respectively formed on the drain vertical lines DVL. The drain horizontal lines DHL may be formed together when forming the drain vertical lines DVL. For example, when providing a conductive material in the openings for forming the drain vertical lines DVL, the conductive material may be provided on the upper surface of the third insulating layer 223. The conductive material provided on the upper surface of the third insulating layer 223 and in direct contact with the drain vertical lines DVL may be defined as drain horizontal lines DHL. The drain regions D may be electrically connected to the data driving unit 103 described with reference to FIGS. 1 and 2 by drain vertical lines DVL and drain horizontal lines DHL.

In addition, source vertical lines SVL and contact vertical lines CVL passing through the second insulating layer 222 and the third insulating layer 223 may be formed. The source vertical lines SVL and the contact vertical lines CVL may be formed together when the drain vertical lines DVL are formed. The source vertical lines SVL and the contact vertical lines CVL may comprise, for example, a conductive material such as a metal. The source vertical lines SVL and the contact vertical lines CVL may be formed by forming openings passing through the second insulating layer 222 and the third insulating layer 223 exposing the source regions S and the contacts CT, respectively, and providing a conductive material in the openings. Although the drawing shows that the conductive material provided in the openings completely fills the openings, embodiments are not limited thereto. In another example, the conductive material extends along the surfaces of the second insulating layer 222 and the third insulating layer 223 exposed by the openings, and may not completely fill the openings. The source vertical lines SVL may be electrically connected to the source regions S, respectively. For example, each of the source vertical lines SVL may directly contact the corresponding source region S, respectively. In addition, the contact vertical lines CVL may be electrically connected to the contacts CT, respectively. For example, each of the contact vertical lines CVL may directly contact the corresponding contact CT, respectively.

Source horizontal lines SHL may be formed on the source vertical lines SVL, respectively. The source horizontal lines SHL may be formed together when forming the source vertical lines SVL. For example, when providing a conductive material in the openings for forming the source vertical lines SVL, the conductive material may be provided on the upper surface of the third insulating layer 223. The conductive material provided on the upper surface of the third insulating layer 223 and directly in contact with the source vertical lines SVL may be defined as the source horizontal lines SHL.

The source horizontal lines SHL may extend on the contact vertical lines CVL in the first direction DR1. Each of the source horizontal lines SHL may electrically connect the source vertical line SVL and the contact vertical line CVL immediately adjacent to each other. For example, both ends of each of the source horizontal lines SHL may directly contact the source vertical line SVL and the contact vertical line CVL immediately adjacent to each other.

The channel region C, the source region S, the drain region D, and the gate electrode G may form a driving transistor. When the display apparatus 100 is driven, the driving transistor may control the light emission operation of the active layer 212 immediately adjacent thereto. Accordingly, a first sub-pixel area SP1, a second sub-pixel area SP2, and a third sub-pixel area SP3 arranged along the first direction DR1 may be defined. The driving transistors and the active layers 212 may be provided in the first to third sub-pixel areas SP1, SP2, and SP3, respectively.

Figure 7:
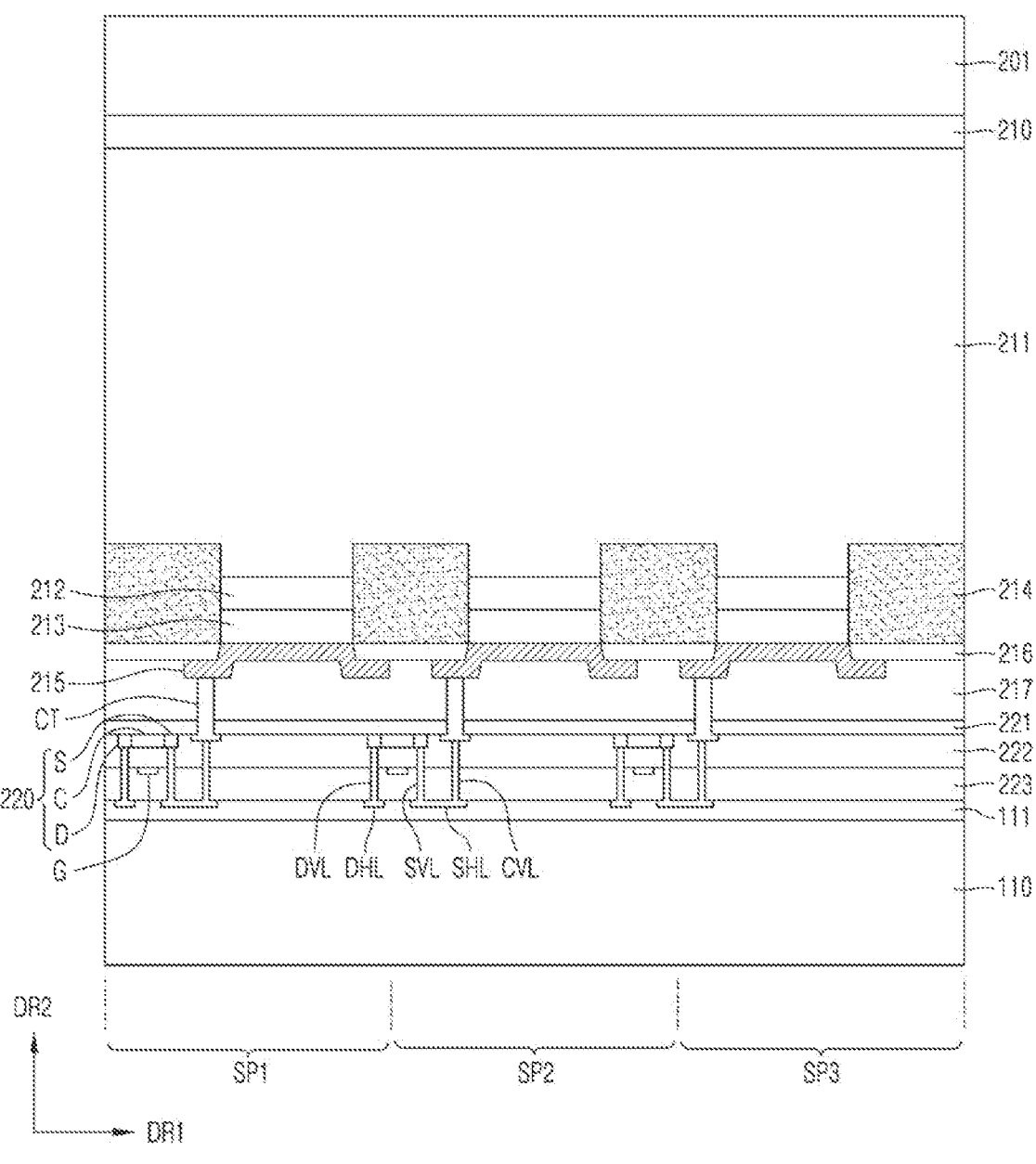

Referring to FIG. 7, the products formed so far may be disposed on a support substrate 110 such that the growth substrate 201 faces upward. Accordingly, the growth substrate 201 may be positioned at the top, and the drain horizontal line DHL and the source horizontal line SHL may be positioned at the bottom. For convenience of description, hereinafter, the second direction DR2 is defined as being opposite to the second direction DR2 of FIGS. 3 to 6. In one example, the support substrate 110 may be directly bonded to the third insulating layer 223, the drain horizontal line DHL, and the source horizontal line SHL. In another example, a bonding layer 111 may be further provided between the supporting substrate 110 and the third insulating layer 223, the drain horizontal line DHL, and the source horizontal line SHL, and the third insulating layer 223, the drain horizontal line DHL, and the source horizontal line SHL may be fixed on the support substrate 110 through the bonding layer 111. The support substrate 110 may be, for example, a silicon substrate or a glass substrate.

Figure 8:
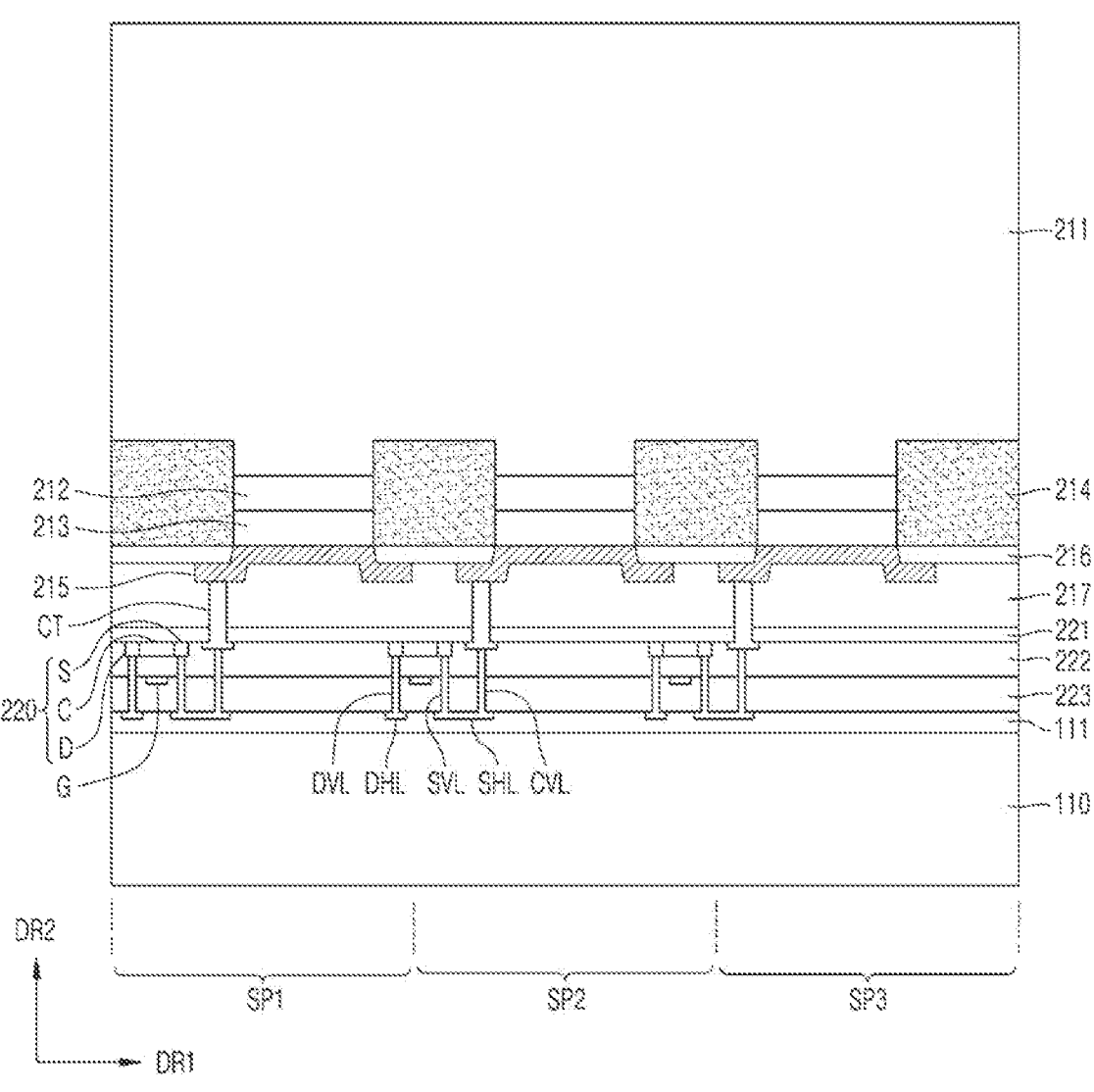

Referring to FIG. 8, the growth substrate 201 may be removed. When the growth substrate 201 is a semiconductor substrate, the growth substrate 201 may be removed through a polishing process and an etching process. For example, the etching process may be a dry etching process. When the growth substrate 201 is a sapphire substrate, the growth substrate 201 may be performed, for example, through a laser lift-off process. The growth substrate 201 may be removed to expose the first buffer layer 210. After the growth substrate 201 is removed, the first buffer layer 210 may be removed through an etching process. Accordingly, the first semiconductor layer 211 may be exposed to the outside.

Figure 9:
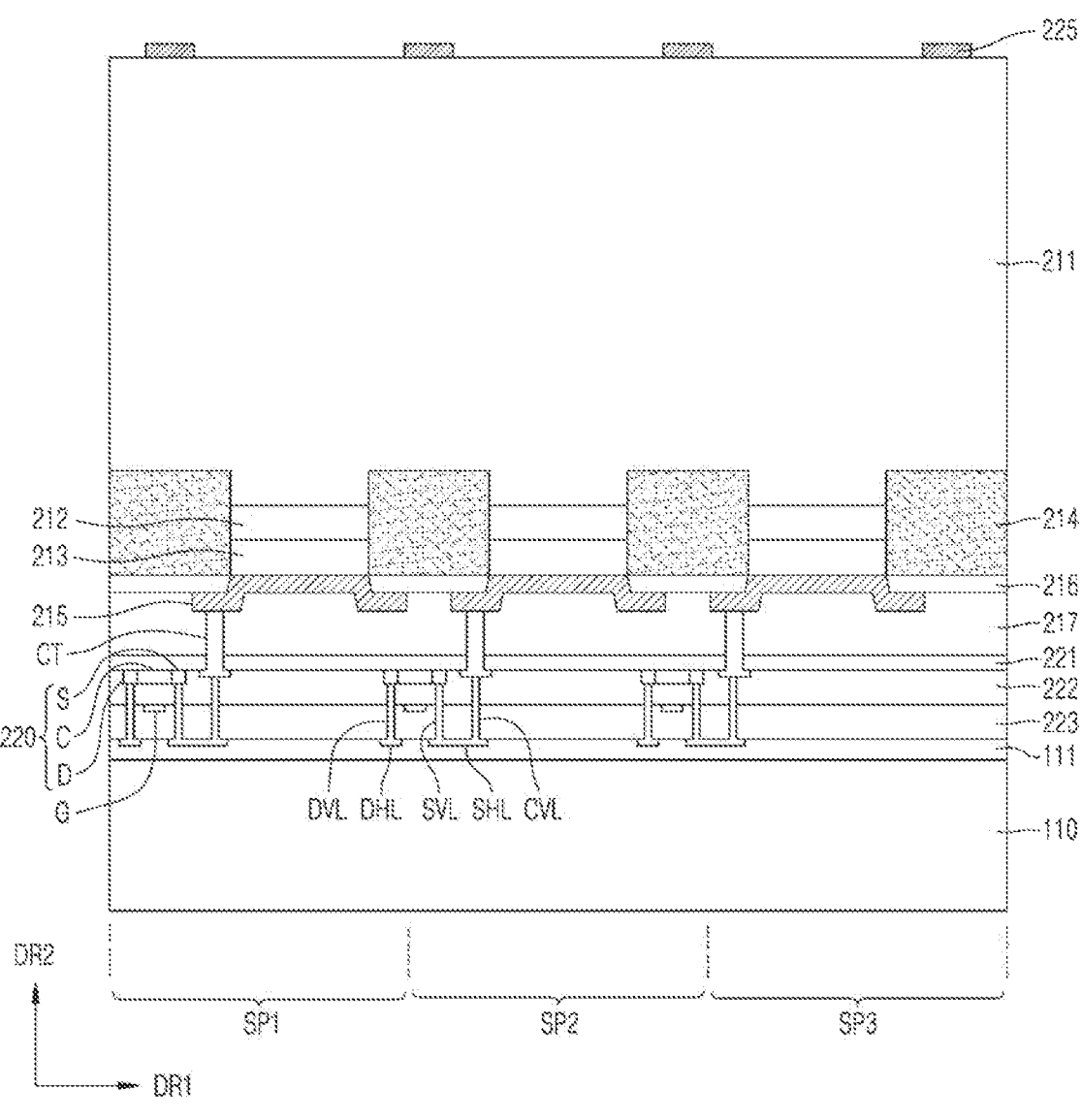

Referring to FIG. 9, a patterned common electrode 225 may be formed on the upper surface of the first semiconductor layer 211 exposed by removing the growth substrate 201 and the first buffer layer 210. For example, after forming a common electrode film on the upper surface of the first semiconductor layer 211 through a CVD process, a PVD process, or an ALD process, the common electrode 225 may be formed by patterning the common electrode film so that the upper surface of the first semiconductor layer 211 is partially exposed. The common electrode 225 may comprise, for example, an opaque conductive metal material.

The common electrode 225 may be disposed at a position overlapping the separation film 214 in the second direction DR2. For example, the common electrode 225 may be disposed at a position facing the center of the separation film 214 in the second direction DR2. In addition, the width of the common electrode 225 along the first direction DR1 may be equal to or less than the width of the separation film 214 along the first direction DR1. Although it appears that the plurality of common electrodes 225 are arranged at regular intervals along the first direction DR1 in the drawing, the common electrode 225 may actually be a single layer having a mesh shape. According to another example embodiment, a plurality of separated common electrodes 225 may be disposed in the first to third sub-pixel areas SP1, SP2, and SP3, respectively. A plurality of openings formed to partially expose the upper surface of the first semiconductor layer 211 may be arranged in two dimensions between the common electrodes 225.

Figure 10:
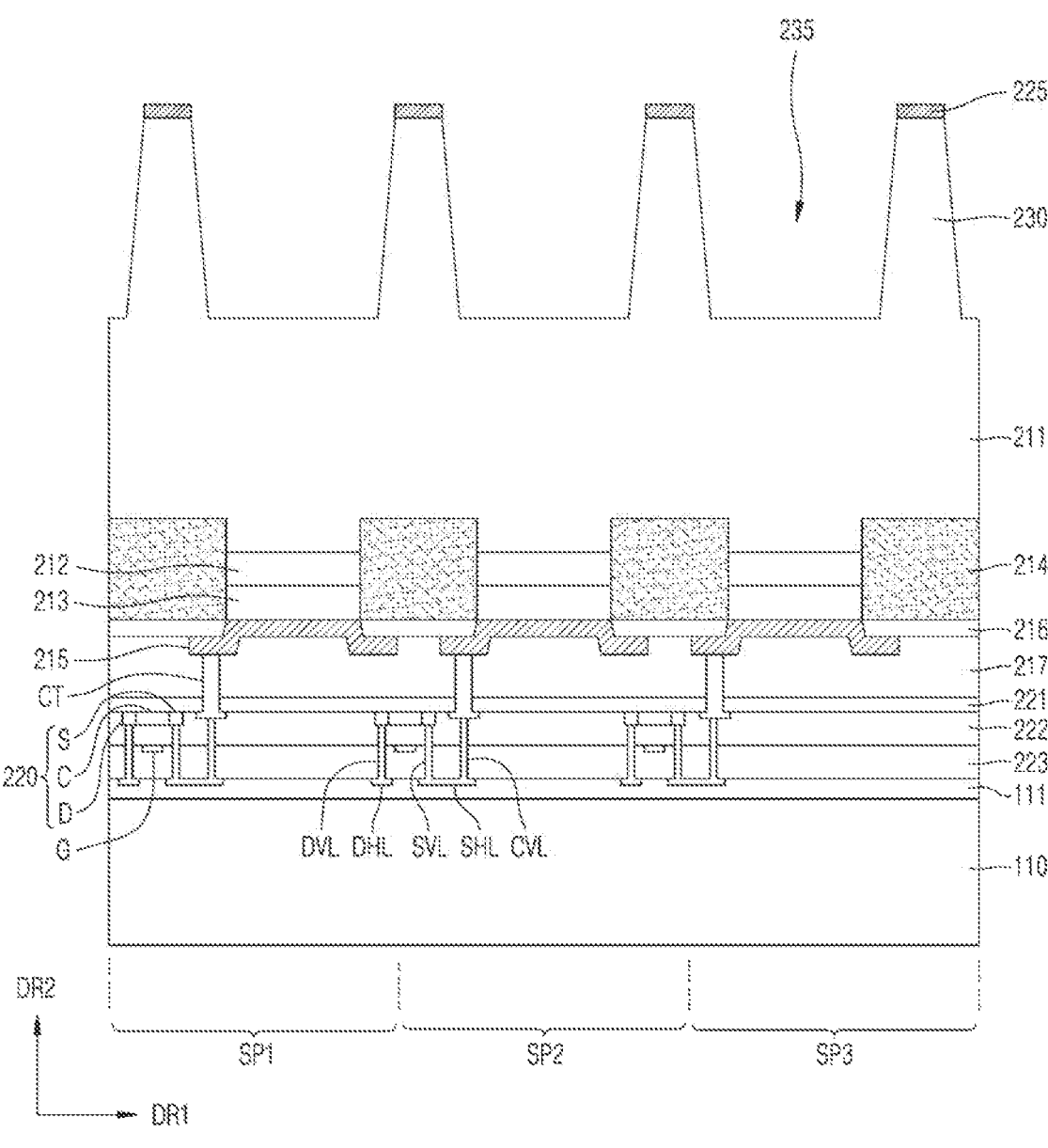

Referring to FIG. 10, partial regions of the first semiconductor layer 211 that are not covered by the common electrode 225 between the common electrodes 225 are etched through a dry etching process so that a plurality of partitions 230 may be formed. The dry etching process is performed so as not to completely penetrate the first semiconductor layer 211. Accordingly, the lower region of the first semiconductor layer 211 remains after etching. In the dry etching process, the common electrode 225 may be used as an etching mask, or if necessary, a dry etching process may be performed after an etching mask is additionally formed on the common electrode 225. The plurality of partitions 230 formed through the dry etching process may have a shape in which the width gradually decreases as going upward in the second direction DR2. Accordingly, the plurality of partitions 230 may have inclined sidewalls. The plurality of partitions 230 may protrude and extend along the second direction DR2 above the upper surface of the first semiconductor layer 211. The plurality of partitions 230 may comprise the same material as the first semiconductor layer 211 and integrally extend from the upper surface of the first semiconductor layer 211.

A plurality of opening areas 235 may be formed between the plurality of partitions 230. For example, opening areas 235 may be formed for the first to third sub-pixel areas SP1, SP2, and SP3, respectively. The plurality of opening areas 235 may be disposed to face each of the plurality of active layers 212 in the second direction DR2. The plurality of opening areas 235 may have a two-dimensional arrangement like the plurality of active layers 212.

Figure 11:
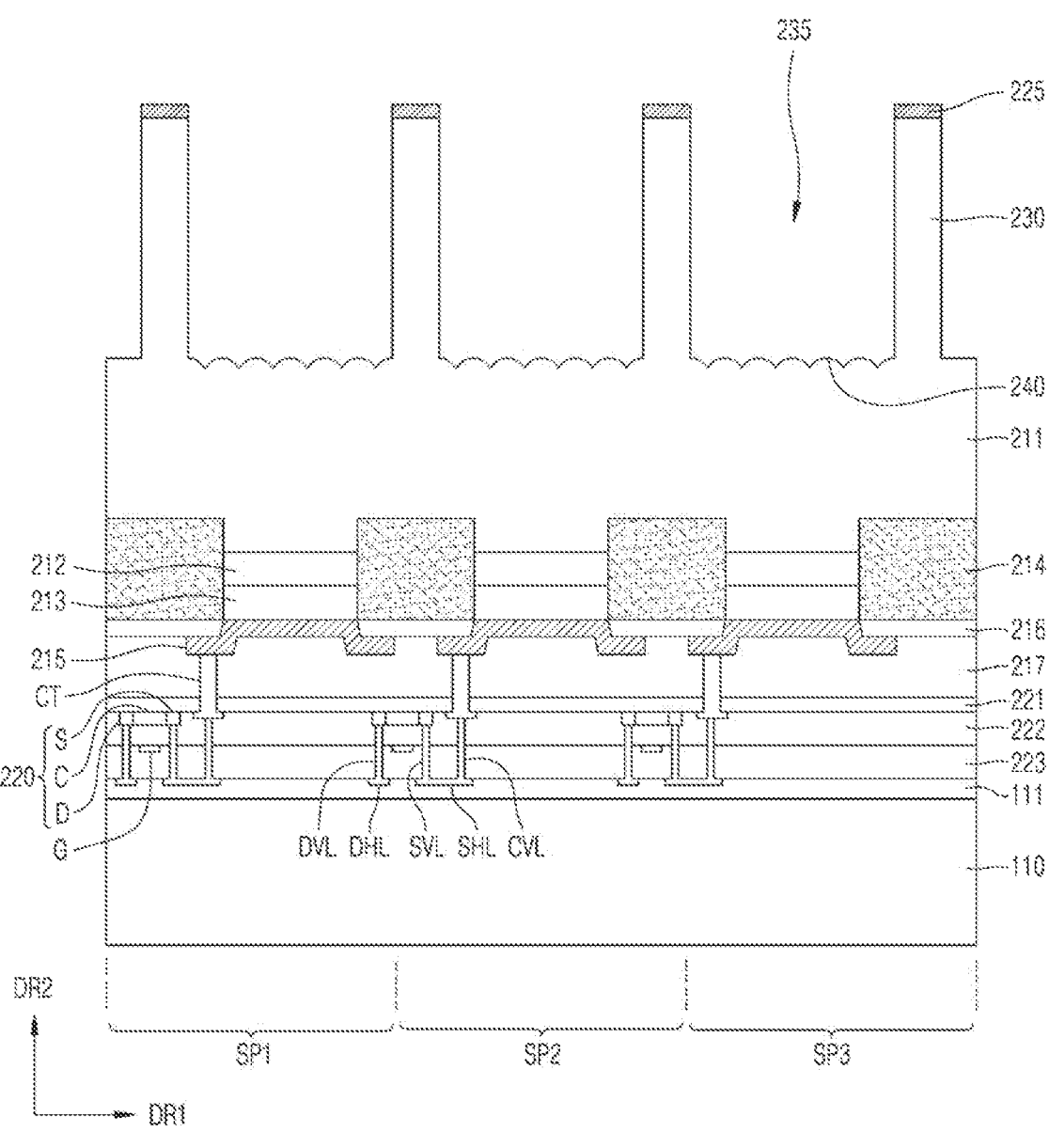

Referring to FIG. 11, by increasing the inclination angle of the inclined sidewalls of the plurality of partitions 230 through a wet etching process, the widths of the plurality of partitions 230 may be made relatively constant in the second direction DR2. The wet etching process may be performed using, for example, a potassium hydroxide (KOH) solution or a tetrammethyl ammonium hydroxide (TMAH) solution as an etchant. In the plurality of partitions 230 formed in this way, an interval in the first direction DR1 between two adjacent partitions 230 may be equal to or greater than a width in the first direction DR1 of each of the plurality of active layers 212.

In this process, a light extraction pattern 240 having a concave-convex shape may be formed on the bottom surface of the opening area 235, that is, on the upper surface of the first semiconductor layer 211 in the opening area 235. The light extraction pattern 240 may be provided in each of the first to third sub-pixel areas SP1, SP2, and SP3, and may be disposed to face the corresponding active layer 212 in the second direction DR2. The light extraction pattern 240 may allow light generated in the active layer 212 to be more easily emitted to the outside through the opening area 235 to increase light extraction efficiency. In addition, the light extraction pattern 240 may allow the light emitted to the outside to have a spatially homogeneous intensity distribution.

Figure 12:
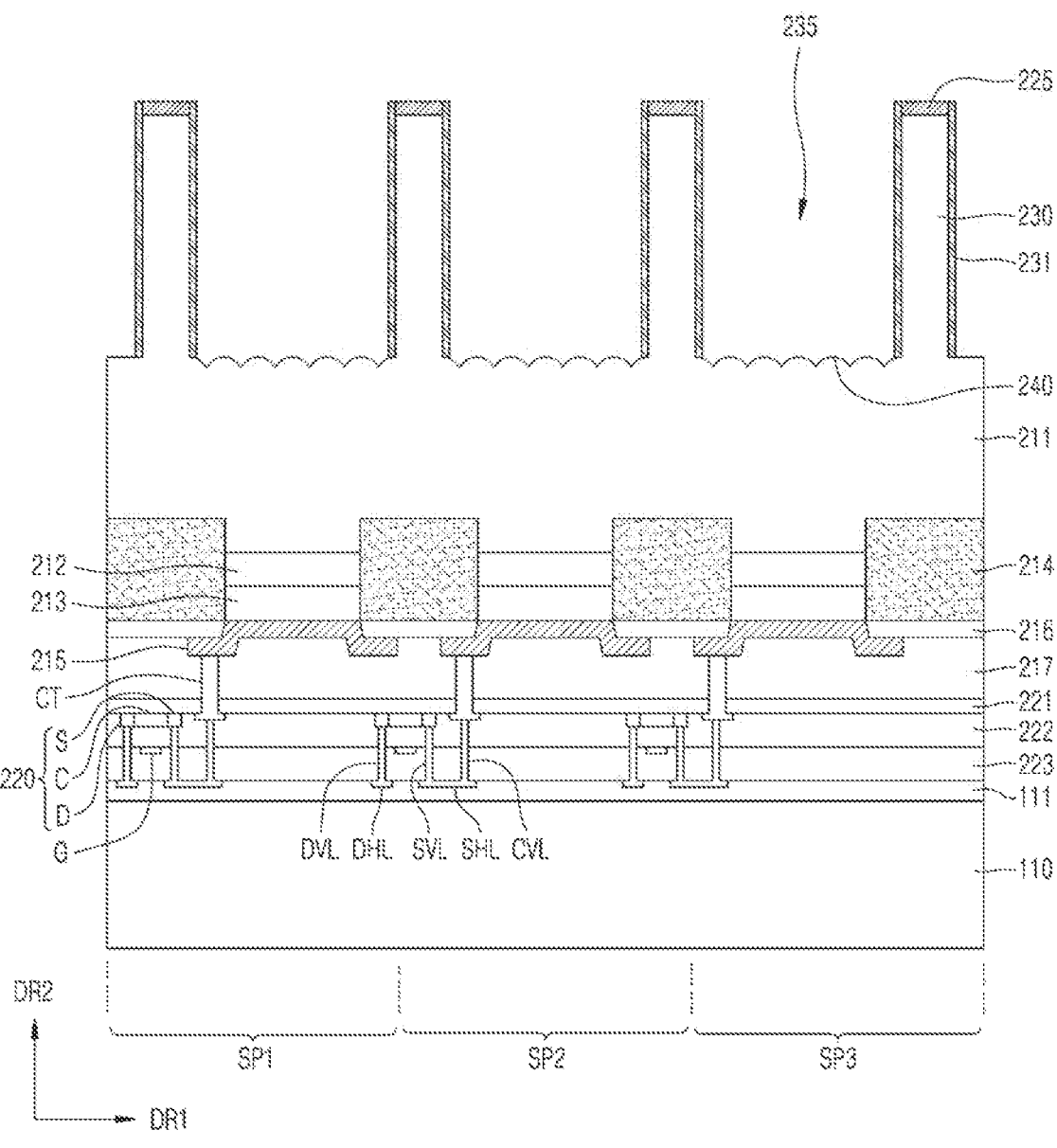

Referring to FIG. 12, a light blocking film 231 may be formed on sidewalls of the plurality of partitions 230. For example, the light blocking film 231 may comprise a light absorbing material or a reflective metallic material. After forming the light absorbing material or the reflective metallic material to cover the common electrode 225, the partition 230, and the opening area 235 with a relatively uniform thickness, the light blocking film 231 may be formed by removing the light absorbing material or the reflective metallic material on the common electrode 225 and the opening area 235 through a dry etching process.

Figure 13:
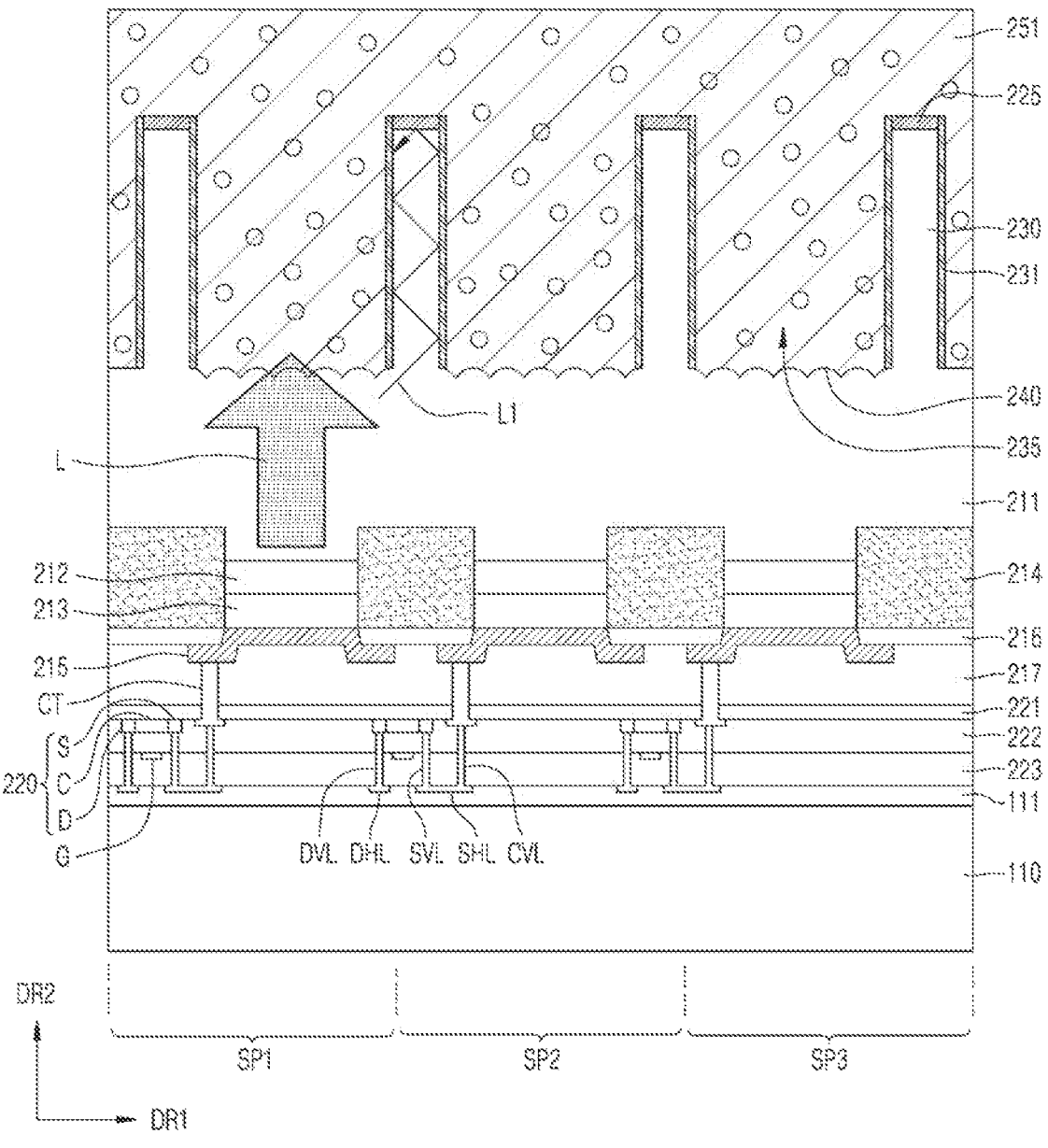

Referring to FIG. 13, a first color conversion layer material 251 may be formed on the plurality of partitions 230 and the plurality of opening areas 235. The first color conversion layer material 251 may be formed to cover all of the common electrode 225, the partition 230, and the opening area 235. For example, the first color conversion layer material 251 may be formed by performing a spin coating process or a spray coating process. The first color conversion layer material 251 may fill all of the opening areas 235 in the first to third sub-pixel areas SP1, SP2, and SP3.

The first color conversion layer material 251 may comprise a quantum dot (QD) or a phosphor that is excited by blue light to emit red light. The QD may have a core-shell structure having a core portion and a shell portion, or may have a particle structure without a shell. The core-shell structure may have a single-shell or a multi-shell. For example, a multi-shell may be a double-shell. In example embodiments, the QD may comprise at least one of a II-VI group semiconductor, a III-V group semiconductor, a IV-VI group semiconductor, a IV group semiconductor, and/or a graphene QD. For example, the QD may comprise at least one of cadmium (Cd), selenium (Se), zinc (Zn), sulfur (S), and indium phosphide (InP), but is not limited thereto. The diameter of the QD may be several tens of nm or less. For example, the diameter of the QD may be about 10 nm or less. In addition, the first color conversion layer material 251 may further comprise a photoresist and a light scattering agent. The QDs or phosphors may be dispersed in the photoresist.

After the first color conversion layer material 251 is formed, the active layer 212 in the first sub-pixel area SP1 may be excited to emit light L. The light L emitted from the active layer 212 in the first sub-pixel area SP1 may be emitted to the first color conversion layer material 251 in the opening area 235 of the first sub-pixel area SP1. For example, a voltage may be applied to the reflective electrode 215 in the first sub-pixel area SP1 to excite the active layer 212 in the first sub-pixel area SP1. According to another example embodiment, when a plurality of individually separated common electrodes 225 are respectively disposed in the first to third sub-pixel areas SP1, SP2, and SP3, a first voltage is applied to the common electrode 225 in the first sub-pixel area SP1, a second voltage lower than the first voltage is applied to at least one of the common electrode 225 in the second sub-pixel area SP2 and the common electrode 225 in the third sub-pixel area SP3, and a ground voltage may be applied to the support substrate 110. The light L emitted from the active layer 212 may be, for example, blue light. The first color conversion layer material 251 in the opening area 235 of the first sub-pixel area SP1 may be cured by the light L emitted from the active layer 212.

Some of the light L1 emitted from the active layer 212 may deviate from the first sub-pixel area SP1 and may be incident into the partition 230 on both sides of the first sub-pixel area SP1. The light L1 incident into the partition 230 may be absorbed in the partition 230 due to the opaque light blocking film 231 and the opaque common electrode 225 or may be reflected by the light blocking film 231 and the common electrode 225 and return toward the first semiconductor layer 211. Accordingly, it is possible to prevent the first color conversion layer material 251 outside the opening area 235 of the first sub-pixel area SP1 from being hardened due to the light L1 incident into the partition 230.

Figure 14:
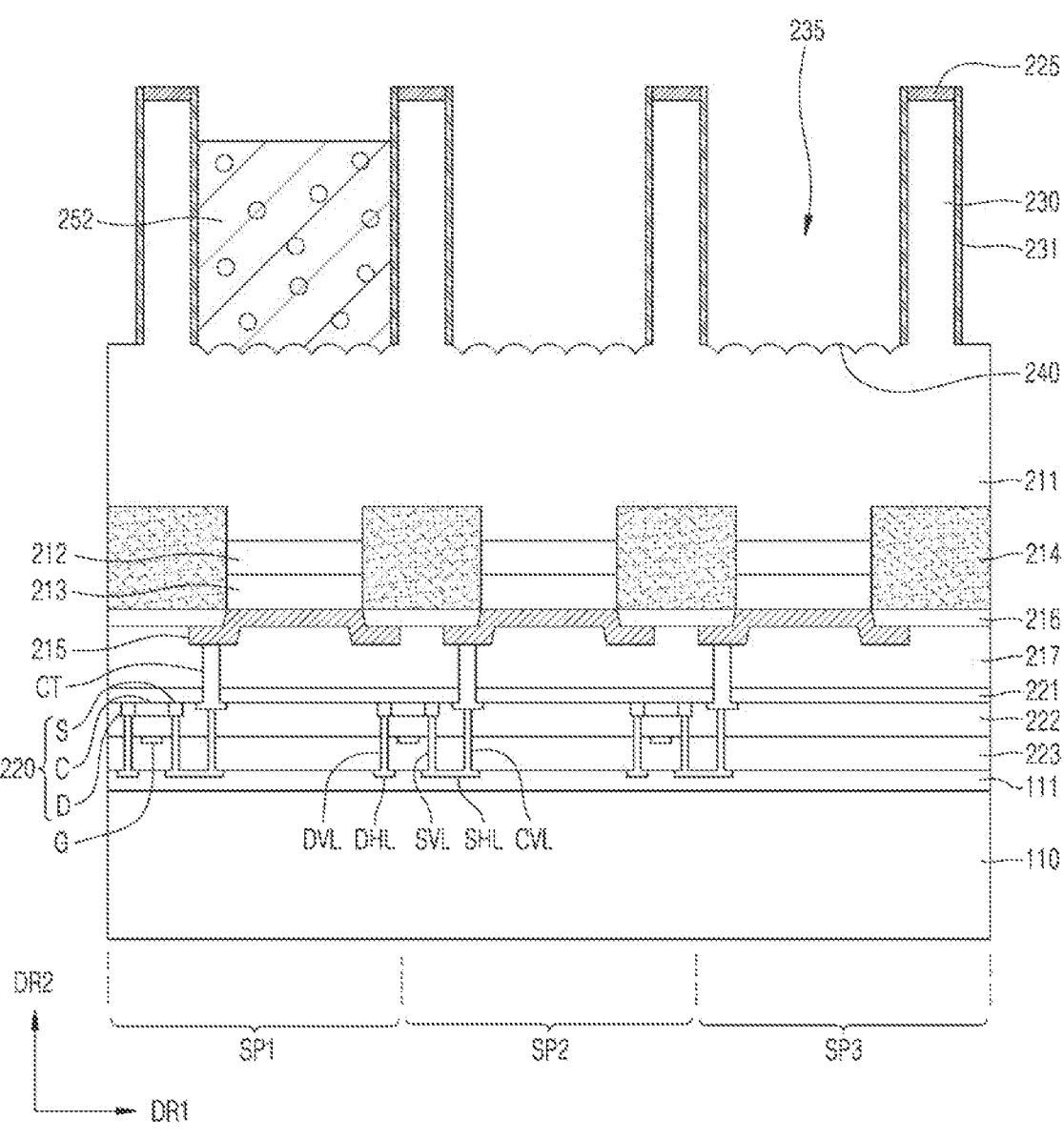

Referring to FIG. 14, an uncured portion of the first color conversion layer material 251 is removed through, for example, a developing process, such that a first color conversion layer 252 may be formed in the opening area 235 of the first sub-pixel area SP1. In example embodiments, the first color conversion layer 252 may be excited by blue light to emit red light. The height of the first color conversion layer 252 formed in this way may be less than the height of the partition 230. For example, the thickness of the first color conversion layer 252 may be adjusted by adjusting the intensity of the light L and/or the emission time of the light L.

Figure 15:
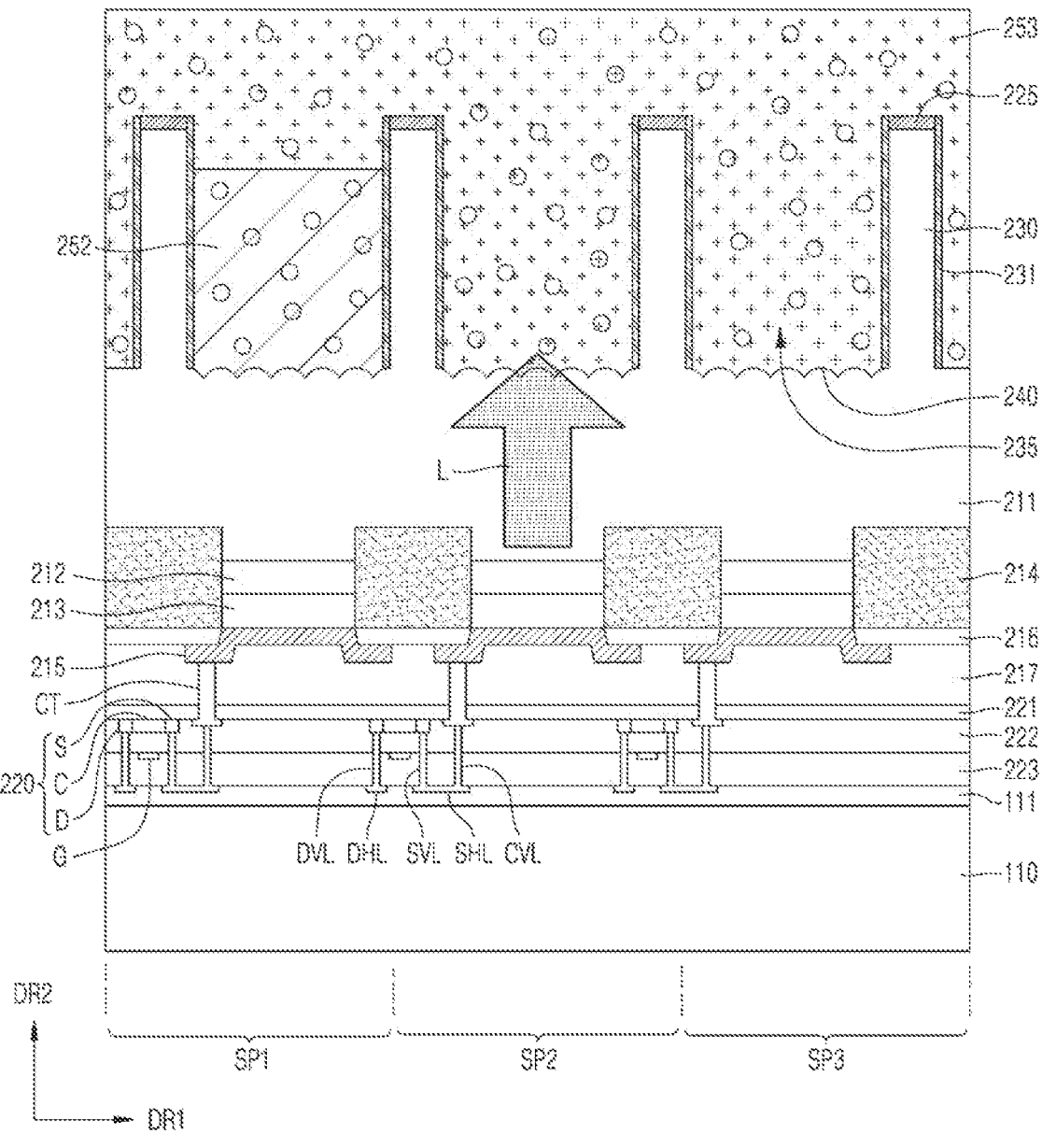

Referring to FIG. 15, a second color conversion layer material 253 may be formed to cover all of the first color conversion layer 252, the common electrode 225, the partition 230, and the opening area 235. For example, the second color conversion layer material 253 may be formed by performing a spin coating process or a spray coating process. The second color conversion layer material 253 may fill the inside of the opening areas 235 of the second and third sub-pixel areas SP2 and SP3. The second color conversion layer material 253 may comprise phosphors or QDs that are excited by blue light to emit green light. In addition, the second color conversion layer material 253 may comprise a photoresist and a light scattering agent.

Thereafter, the light L may be emitted by exciting the active layer 212 in the second sub-pixel area SP2. The light L emitted from the active layer 212 in the second sub-pixel area SP2 may be emitted to the second color conversion layer material 253 in the opening area 235 of the second sub-pixel area SP2. For this, a voltage may be applied to the reflective electrode 215 in the second sub-pixel area SP2. According to another example embodiment, when a plurality of separate and separated common electrodes 225 are respectively disposed in the first to third sub-pixel areas SP1, SP2, and SP3, a third voltage is applied to the common electrode 225 in the second sub-pixel area SP2, a fourth voltage lower than the third voltage is applied to at least one of the common electrode 225 in the first sub-pixel area SP1 and the common electrode 225 in the third sub-pixel area SP3, and a ground voltage may be applied to the support substrate 110. The light L emitted from the active layer 212 may be, for example, blue light. The second color conversion layer material 253 in the opening area 235 of the second sub-pixel area SP2 may be cured by the light L emitted from the active layer 212.

Figure 16:
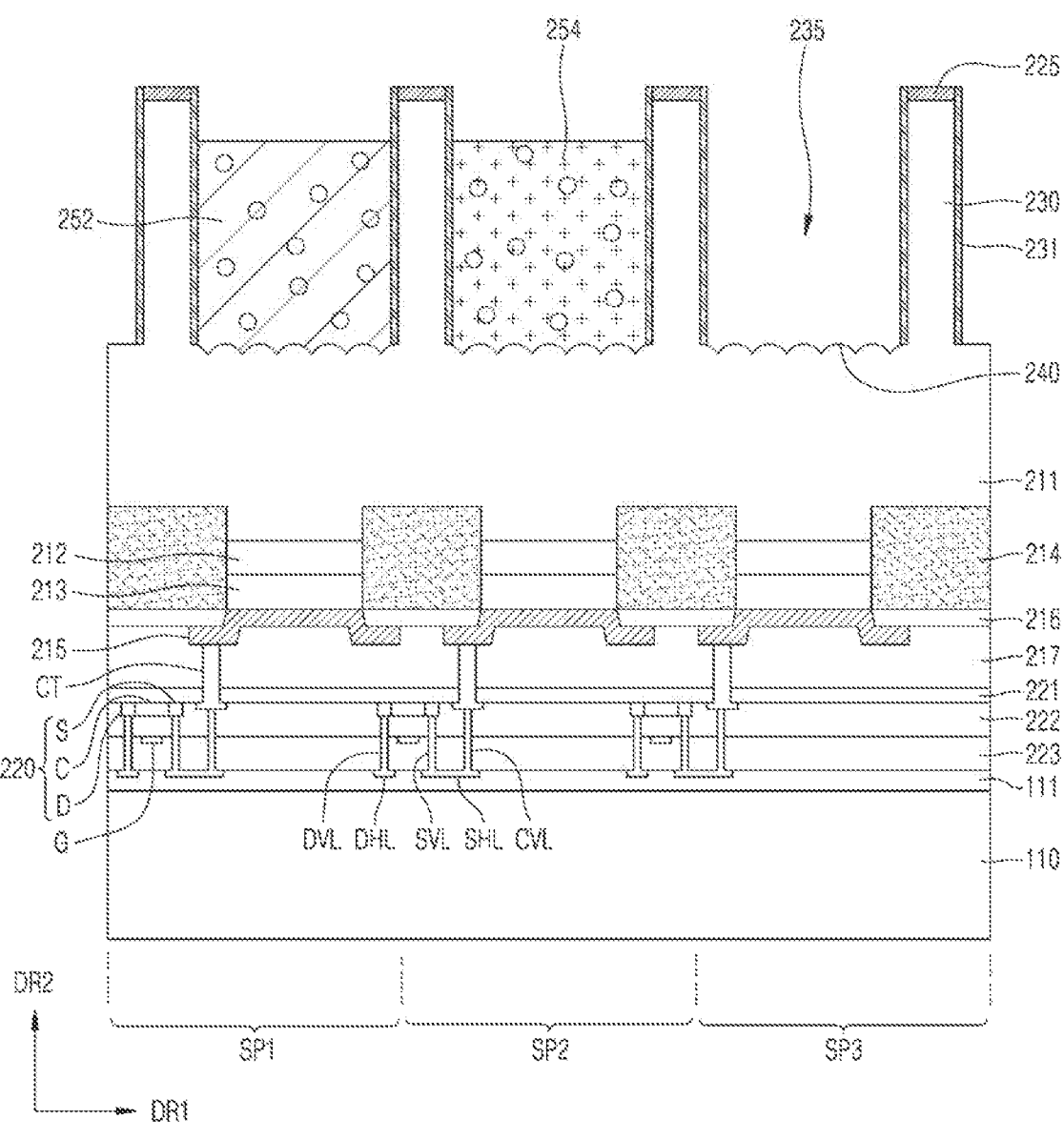

Referring to FIG. 16, an uncured portion of the second color conversion layer material 253 is removed through, for example, a developing process, such that a second color conversion layer 254 may be formed in the opening area 235 of the second sub-pixel area SP2. In example embodiments, the second color conversion layer 254 may be excited by blue light to emit green light. The height of the second color conversion layer 254 formed in this way may be less than the height of the partition 230. For example, the thickness of the second color conversion layer 254 may be adjusted by adjusting the intensity of the light L and/or the emission time of the light L.

Figure 17:
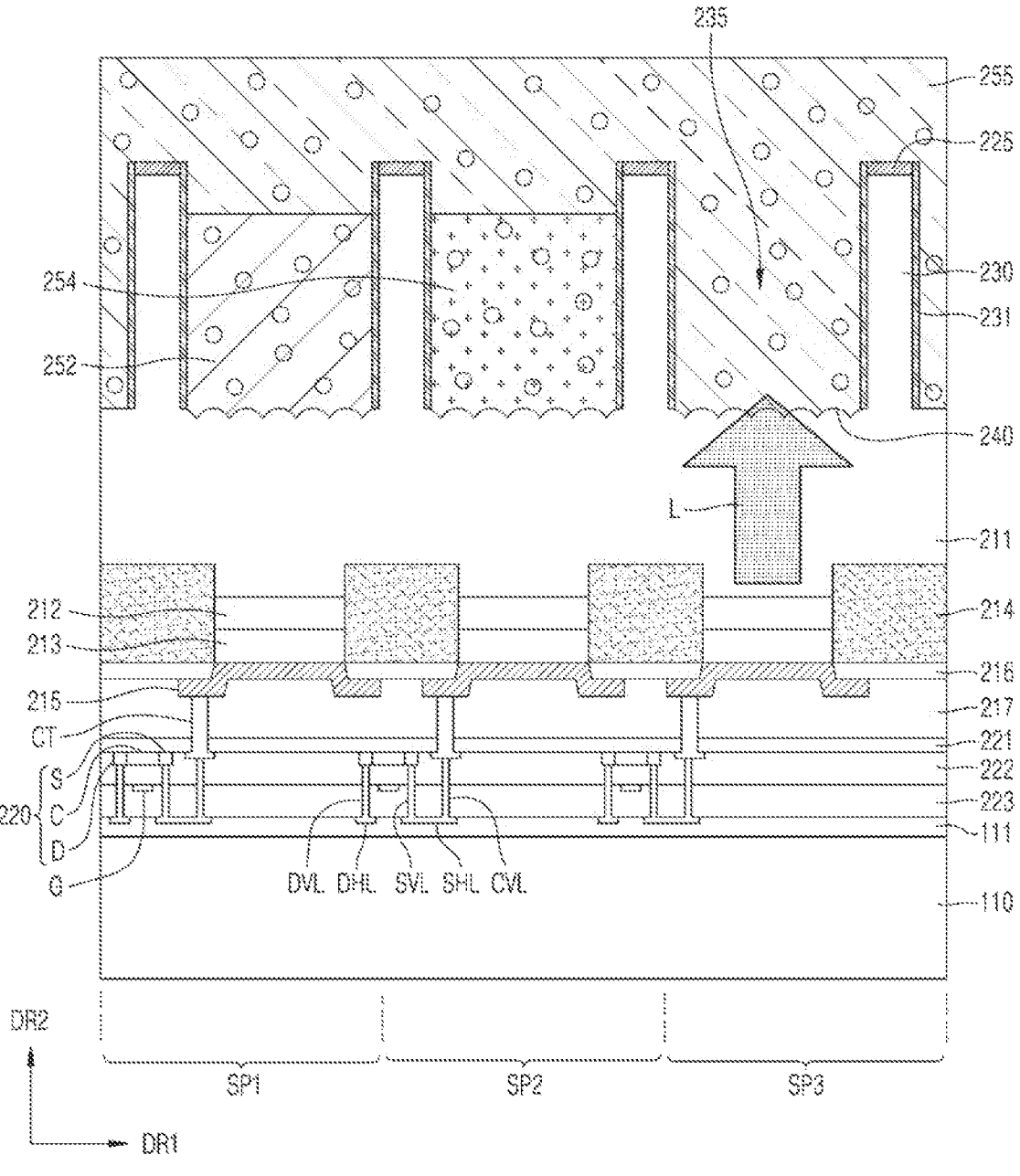

Referring to FIG. 17, a third color conversion layer material 255 may be formed to cover all of the first color conversion layer 252, the second color conversion layer 254, the common electrode 225, the partition 230, and the opening area 235. The third color conversion layer material 255 may fill the inside of the opening areas 235 of the third sub-pixel area SP3. The third color conversion layer material 255 may comprise phosphors or QDs that are excited by blue light to emit blue light. In addition, the third color conversion layer material 255 may comprise a photoresist and a light scattering agent.

Thereafter, the light L may be emitted by exciting the active layer 212 in the third sub-pixel area SP3. Light L emitted from the active layer 212 in the third sub-pixel area SP3 may be emitted to the third color conversion layer material 255 in the opening area 235 of the third sub-pixel area SP3. For this, a voltage may be applied to the reflective electrode 215 in the third sub-pixel area SP3. According to another example embodiment, when a plurality of separate and separated common electrodes 225 are respectively disposed in the first to third sub-pixel areas SP1, SP2, and SP3, a fifth voltage is applied to the common electrode 225 in the third sub-pixel area SP3, a sixth voltage lower than the fifth voltage is applied to at least one of the common electrode 225 in the first sub-pixel area SP1 and the common electrode 225 in the second sub-pixel area SP2, and a ground voltage may be applied to the support substrate 110. The light L emitted from the active layer 212 may be, for example, blue light. The third color conversion layer material 255 in the opening area 235 of the third sub-pixel area SP3 may be cured by the light L emitted from the active layer 212.

Figure 18:
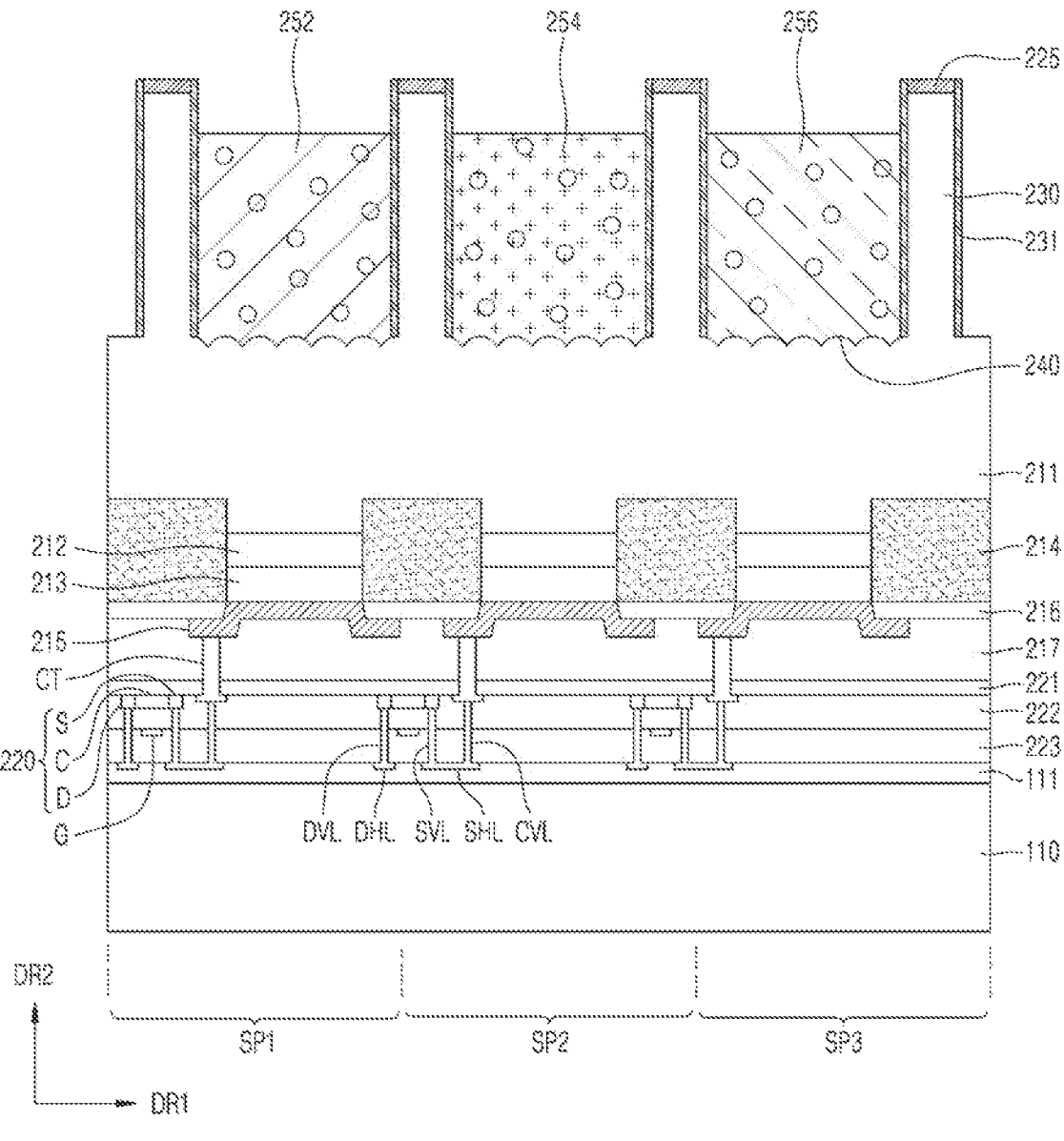

Referring to FIG. 18, an uncured portion of the third color conversion layer material 255 is removed through, for example, a developing process, such that a third color conversion layer 256 may be formed in the opening area 235 of the third sub-pixel area SP3. In example embodiments, the third color conversion layer 256 may be excited by blue light to emit blue light. The height of the third color conversion layer 256 formed in this way may be less than the height of the partition 230. For example, the thickness of the third color conversion layer 256 may be adjusted by adjusting the intensity of the light L and/or the emission time of the light L.

Figure 19:
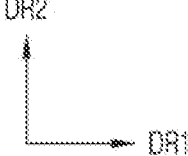

Referring to FIG. 19, a transparent fourth insulating layer 260 may be formed to cover all of the common electrode 225, the plurality of partitions 230, the first color conversion layer 252, the second color conversion layer 254, and the third color conversion layer 256. The fourth insulating layer 260 may have transparency for light emitted from the first color conversion layer 252, the second color conversion layer 254, and the third color conversion layer 256. For example, the fourth insulating layer 260 may comprise $SiO_2$, $Al_2O_3$, SiN, AlN, or a combination thereof. The fourth insulating layer 260 may have a flat surface extending in the first direction DR1. In addition, a sealing layer 270 may be formed on the fourth insulating layer 260. The sealing layer 270 may comprise an insulating material. For example, sealing layer 270 may comprise $SiO_2$, $Al_2O_3$, SiN, AlN, or a combination thereof, or may comprise a transparent plastic material, or glass.

Through the above-described method, the display apparatus 100 according to the example embodiment may be manufactured. Referring to FIG. 19, the display apparatus 100 may comprise a support substrate 110, a plurality of semiconductor patterns 220 disposed on the support substrate 110, a plurality of reflective electrodes 215 each electrically connected to the source region S of the plurality of semiconductor patterns 220, a plurality of second semiconductor layers 213 respectively disposed on the plurality of reflective electrodes 215, a plurality of active layers 212 respectively disposed on the plurality of second semiconductor layers 213, an insulating separation film 214 disposed between two adjacent active layers 212 and between two adjacent second semiconductor layers 213, a first semiconductor layer 211 disposed to cover the plurality of active layers 212 and the plurality of separation films 214 and comprising a plurality of partitions 230 and a plurality of opening areas 235 between the plurality of partitions 230, and a plurality of first to third color conversion layers 252, 254, and 256 disposed in the plurality of opening areas 235. The reflective electrode 215 may be electrically connected to the corresponding second semiconductor layer 213. Accordingly, the plurality of semiconductor patterns 220 may be driving transistors for driving the corresponding active layer 212 through the reflective electrode 215.

The first semiconductor layer 211 has a first surface (i.e., an upper surface) and a second surface (i.e., a lower surface) facing each other, and the plurality of partitions 230 may protrude and extend above the first surface of the first semiconductor layer 211. The plurality of partitions 230 may comprise the same material as the first semiconductor layer 211 and integrally extend from the first surface of the first semiconductor layer 211. The plurality of partitions 230 may have vertical sidewalls. A light blocking film 231 may be disposed on a sidewall of each partition 230. The first surface of the first semiconductor layer 211 in the plurality of opening areas 235 between the plurality of partitions 230 may comprise the light extraction pattern 240 having a concave-convex shape.

The plurality of active layers 212 may be disposed to face the plurality of opening areas 235 on the second surface of the first semiconductor layer 211. A plurality of second semiconductor layers 213 respectively corresponding to the plurality of active layers 212 may be disposed under the plurality of active layers 212. The first semiconductor layer 211 may be doped with a first conductivity type, and the plurality of second semiconductor layers 213 may be doped with a second conductivity type that is electrically opposite to the first conductivity type.

In addition, the display apparatus 100 comprises a first sub-pixel area SP1, a second sub-pixel area SP2, and a third sub-pixel area SP3. One semiconductor pattern 220, one second semiconductor layer 213, one active layer 212, the first semiconductor layer 211, and the first color conversion layer 252 may be disposed in the first sub-pixel area SP1, and one semiconductor pattern 220, one second semiconductor layer 213, one active layer 212, the first semiconductor layer 211, and the second color conversion layer 254 may be disposed in the second sub-pixel area SP2, and one semiconductor pattern 220, one second semiconductor layer 213, one active layer 212, the first semiconductor layer 211, and the third color conversion layer 256 may be disposed in the third sub-pixel area SP3. A plurality of first to third sub-pixel areas SP1, SP2, and SP3 having such a structure may be arranged in two dimensions.

The display apparatus 100 may further comprise a common electrode 225 disposed on upper surfaces of the plurality of partitions 230. The common electrode 225 may be a single layer having a mesh shape, or a plurality of individually separated common electrodes 225 may be respectively disposed in the first to third sub-pixel areas SP1, SP2, and SP3. The common electrode 225 may comprise an opaque metal material.

An interval between two adjacent partitions 230 may be equal to or greater than the width of each of the plurality of active layers 212. The plurality of second semiconductor layers 213, the plurality of active layers 212, and the first semiconductor layer 211 may form a light emitting element. In particular, the light emitting element may be a micro light emitting element. For example, a width of each of the plurality of active layers 212 different in the first direction DR1 may be in a range of about 0.1 μm to about 100 μm.

The plurality of active layers 212 are configured to emit blue light, and the first to third color conversion layers 252, 254, and 256 may be excited by blue light to emit red light, green light, and blue light, respectively. The first to third color conversion layers 252, 254, and 256 may comprise photoresist and QDs or phosphors dispersed in the photoresist. In addition, the first to third color conversion layers 252, 254, and 256 may further comprise a light scattering agent. Each of the first to third color conversion layers 252, 254, and 256 may have a thickness less than a thickness of the plurality of partitions 230.

In addition, the display apparatus 100 may comprise a driving circuit layer DCL disposed on the support substrate 110 and a light emitting layer LEL disposed on the driving circuit layer DCL. The driving circuit layer DCL may be disposed between the support substrate 110 and the light emitting layer LEL. In other words, the driving circuit layer DCL may be disposed between the support substrate 110 and the plurality of second semiconductor layers 213 and between the support substrate 110 and the insulating separation film 214. The driving circuit layer DCL may comprise a driving circuit configured to independently drive the plurality of active layers 212. For example, the driving circuit layer DCL may comprise the plurality of semiconductor patterns 220, the plurality of reflective electrodes 215, the passivation layer 216, the first insulating layer 217, the second buffer layer 221, the second insulating layer 222, the third insulating layer 223, the plurality of contacts CT, the plurality of drain vertical lines DVL, the plurality of drain horizontal lines DHL, the plurality of source vertical lines SVL, the plurality of contact vertical lines CVL, and the plurality of source horizontal lines SHL. The driving circuit layer DCL may further comprise the scan driving unit 102, the data driving unit 103 and the processor 104 shown in FIG. 2. The scan driving unit 102, the data driving unit 103 and the processor 104 may be formed together with the plurality of semiconductor patterns 220.

As illustrated in FIGS. 5 and 6, the driving circuit layer DCL may be formed on the separation film 214 and the plurality of second semiconductor layers 213 after forming the separation film 214. After forming the driving circuit layer DCL, the support substrate 110 may be bonded to the driving circuit layer DCL, as illustrated in FIG. 7.

The light emitting layer LEL may comprise the plurality of second semiconductor layers 213 disposed on the driving circuit layer DCL, the insulating separation film 214 disposed on the driving circuit layer DCL, the plurality of active layers 212, the first semiconductor layer 211 comprising the plurality of partitions 230 and the plurality of opening areas 235, a plurality of first to third color conversion layers 252, 254, and 256, and the fourth insulating layer 260.

According to the manufacturing method of the display apparatus 100 described above, because both the light emitting element and the driving transistor are formed on the growth substrate, difficult transfer technology for transferring light emitting elements on a display panel is not required. Accordingly, it is possible to reduce the manufacturing cost and manufacturing time of the display apparatus 100. In addition, by using the first semiconductor layer 211 of the light emitting element as the partition 230, it is possible to further reduce the manufacturing cost of the display apparatus 100 because the first to third color conversion layers 252, 254, and 256 for color realization may be patterned without a lithography process and a mask. In addition, because it is possible to more easily form a structure to prevent light leakage in the partition 230, after patterning the first to third color conversion layers 252, 254, and 256, almost no residue remains. Accordingly, the display apparatus 100 may have a relatively high resolution of, for example, 5000 pixels per inch (ppi) or more.

In addition, because the thickness of the first to third color conversion layers 252, 254, and 256 may be adjusted by adjusting the intensity of the light L and/or the time for emitting the light L, the first to third color conversion layers 252, 254, and 256 may be more easily adjusted. In particular, it is possible to differently control the thicknesses of the first to third color conversion layers 252, 254, and 256 in consideration of required color purity. Accordingly, color purity of the display apparatus 100 may be improved.

Figure 20:
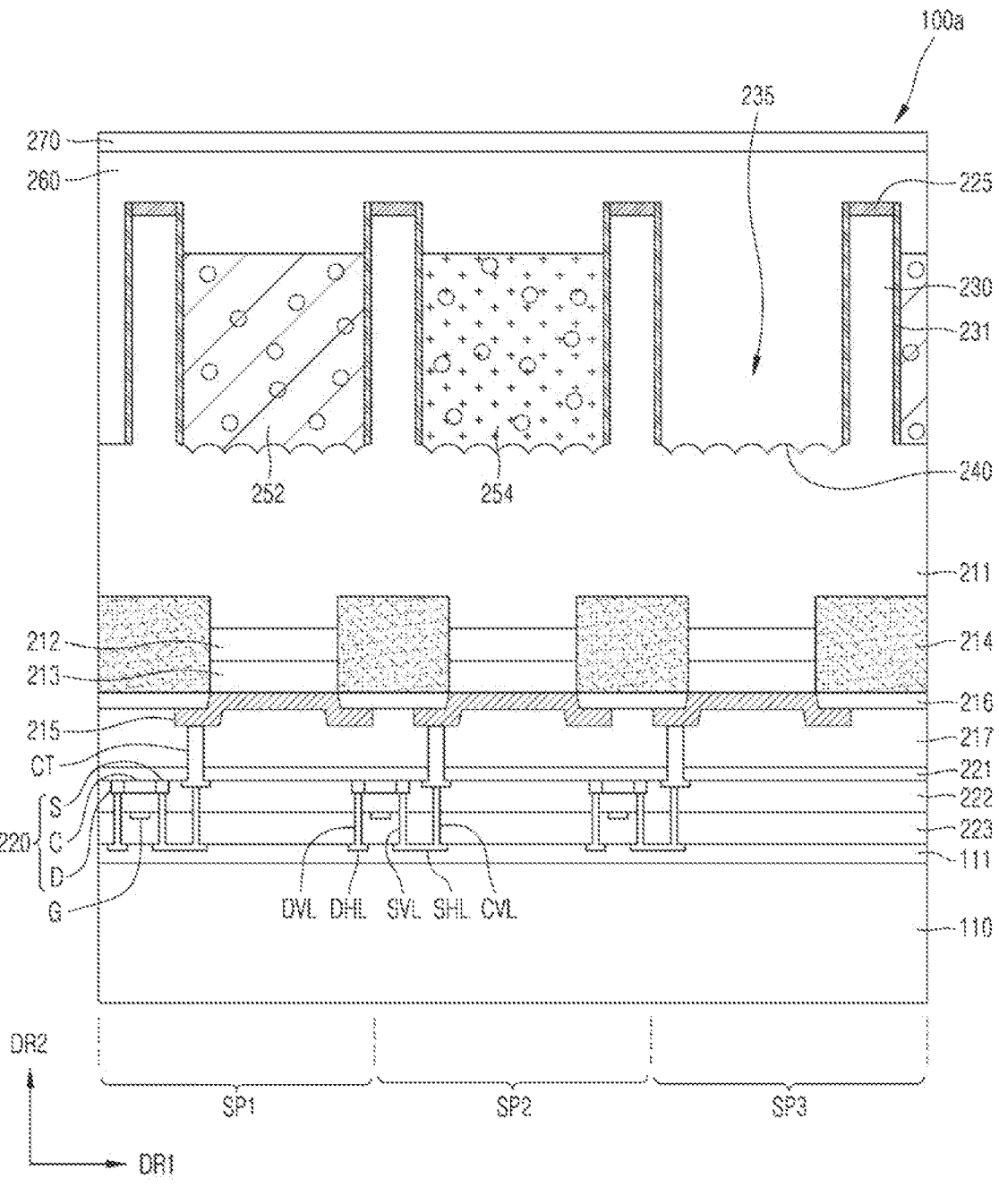
FIG. 20 is a cross-sectional view illustrating a configuration of a display apparatus according to another example embodiment.

FIG. 20 is a cross-sectional view schematically illustrating a configuration of a display apparatus according to another example embodiment. A color conversion layer may not be disposed in at least one of the plurality of opening areas 235 and the fourth insulating layer 260 may be filled therein. For example, when the plurality of active layers 212 are configured to emit blue light, the third color conversion layer 256 may be omitted from the third sub-pixel area SP3 that is a blue sub-pixel. Referring to FIG. 20, the display apparatus 100a may comprise a first color conversion layer 252 disposed in the opening area 235 of the first sub-pixel area SP1, and a second color conversion layer 254 disposed in the opening area 235 of the second sub-pixel area SP2. A color conversion layer may not be disposed in the opening area 235 of the third sub-pixel area SP3. The fourth insulating layer 260 may be disposed to cover the first color conversion layer 252 and the second color conversion layer 254 and fill the opening area 235 of the third sub-pixel area SP3.

FIGS. 21 to 27 are cross-sectional views illustrating an exemplary manufacturing process of a display apparatus according to another example embodiment. According to an example embodiment, after performing the process shown in FIG. 18, a color filter may be further formed before forming the fourth insulating layer 260 and the sealing layer 270.

Figure 21:
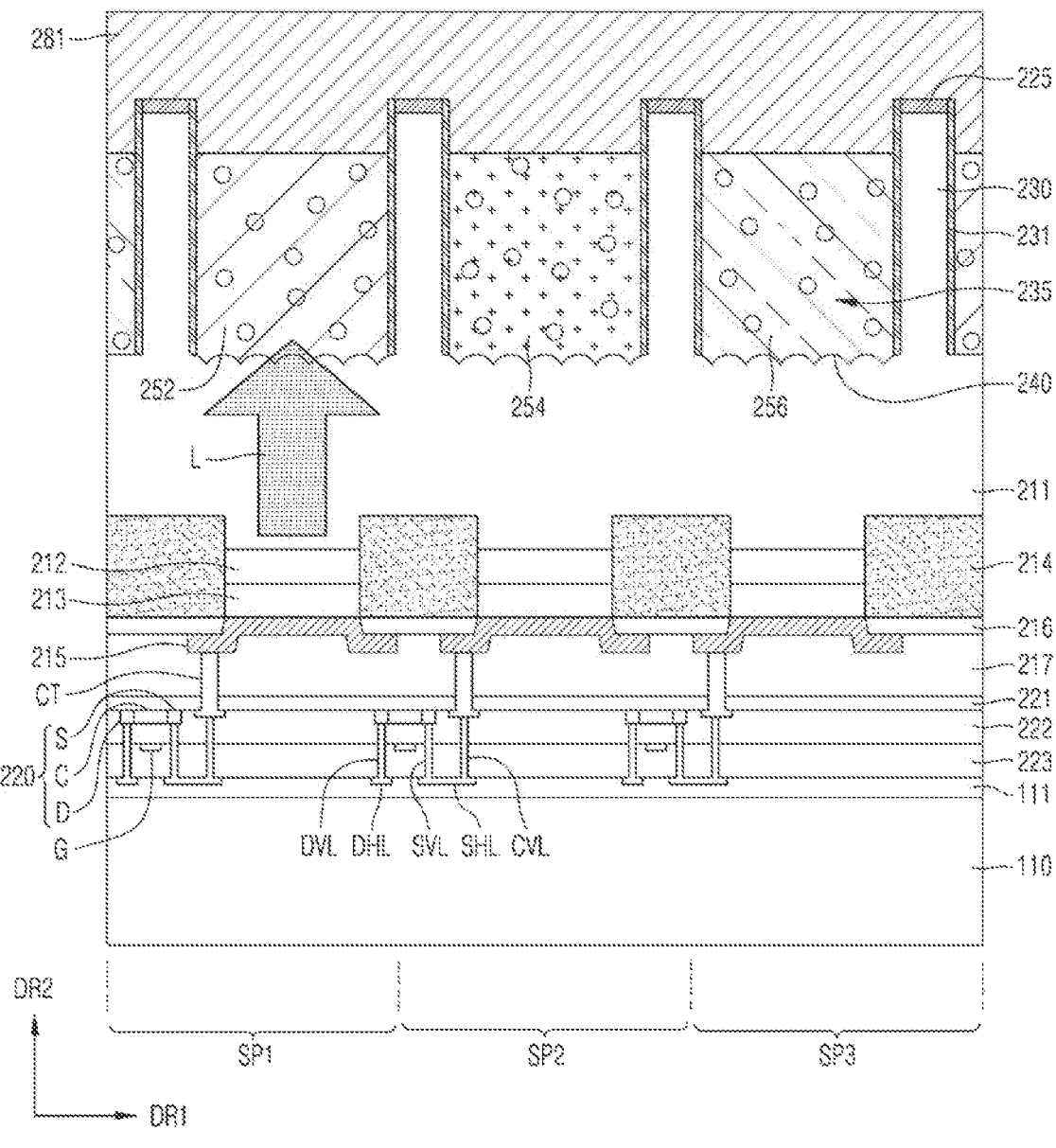
FIGS. 21, 22, 23, 24, 25, 26, and 27 are cross-sectional views illustrating an example manufacturing process of a display apparatus according to another example embodiment.

Referring to FIG. 21, a first color filter material 281 may be formed to cover all of the common electrode 225, the partition 230, the first color conversion layer 252, the second color conversion layer 254, and the third color conversion layer 256. The first color filter material 281 may comprise a red dye or pigment that transmits red light and absorbs green and blue light, a photoresist, and a light scattering agent. The red dye or pigment may be present dispersed in the photoresist. After the first color filter material 281 is formed, the light L may be emitted by exciting the active layer 212 in the first sub-pixel area SP1. The light L emitted from the active layer 212 in the first sub-pixel area SP1 may pass through the first color conversion layer 252, and may be emitted to the first color filter material 251 within the opening area 235 of the first sub-pixel area SP1. Although a portion of blue light is converted into red light by the first color conversion layer 252, the first color filter material 281 may be cured by remaining blue light without being converted to red light.

Figure 22:
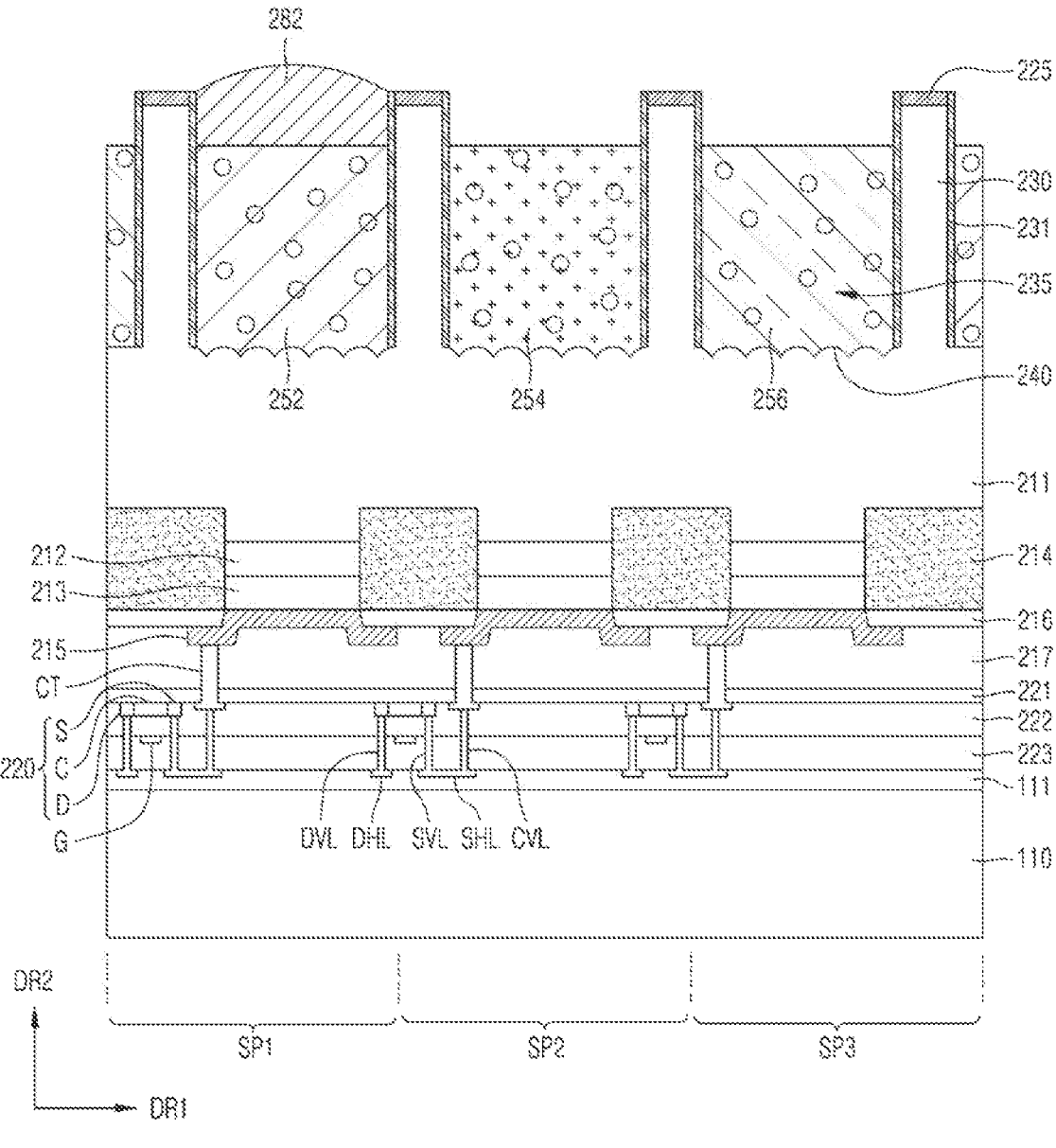

Referring to FIG. 22, an uncured portion of the first color filter material 281 is removed such that a first color filter 282 may be formed on the first color conversion layer 252 in the opening area 235 of the first sub-pixel area SP1. According to an example embodiment, the first color conversion layer 252 and the first color filter 282 may be disposed together in the opening area 235 between the partitions 230. In particular, the first color filter 282 may be arranged in direct contact with the upper surface of the corresponding first color conversion layer 252 under the first color filter 282. The thickness of the first color filter 282 may be selected such that the sum of the thickness of the first color conversion layer 252 and the thickness of the first color filter 282 is similar to the thickness of the partition 230. The first color filter 282 may be an absorption type color filter that transmits red light and absorbs green light and blue light.

Figure 23:
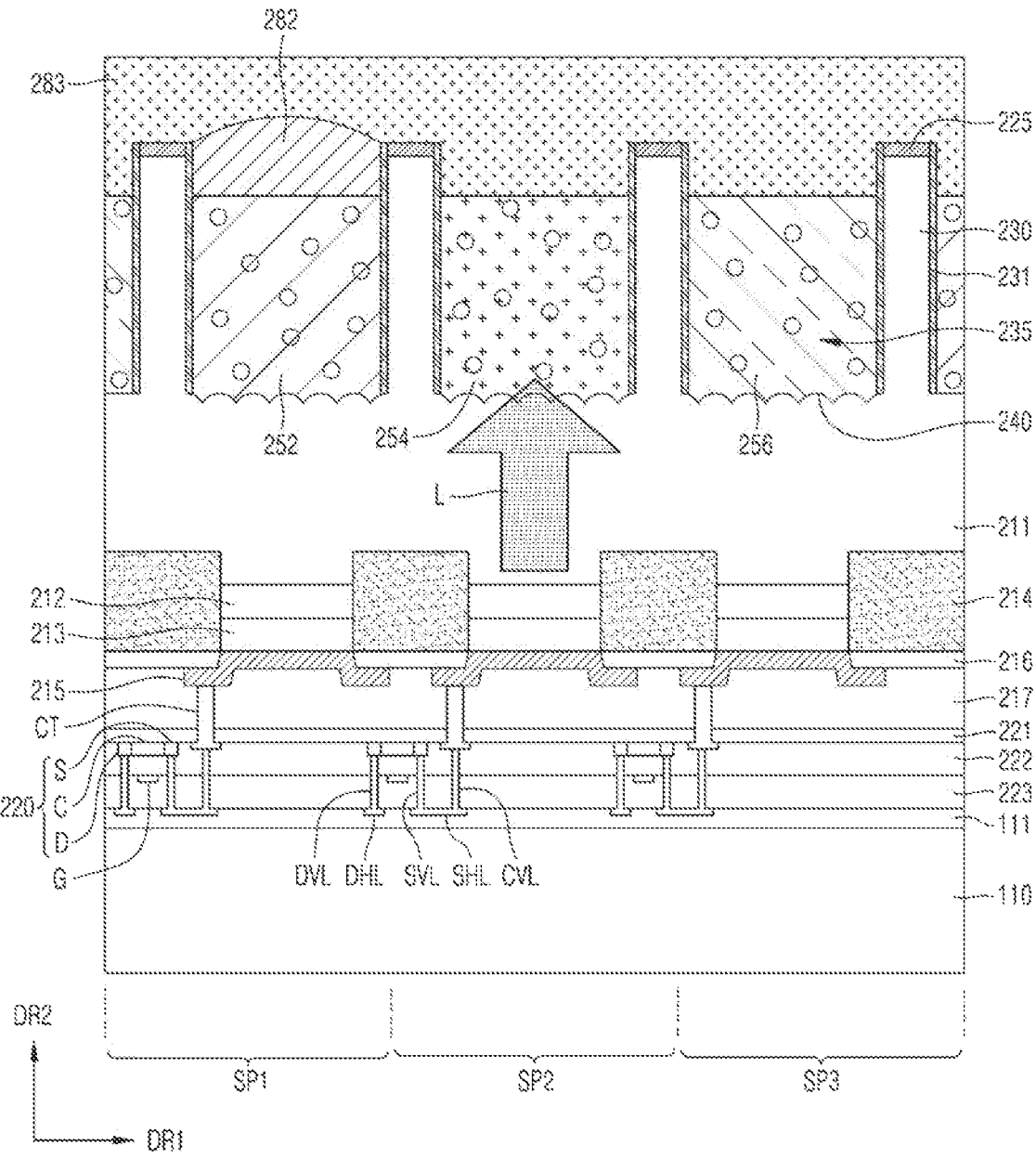

Referring to FIG. 23, a second color filter material 283 may be formed to cover all of the common electrode 225, the partition 230, the first color filter 282, the second color conversion layer 254, and the third color conversion layer 256. The second color filter material 283 may comprise a green dye or pigment that transmits green light and absorbs red and blue light, a photoresist, and a light scattering agent. The green dye or pigment may be present dispersed in the photoresist. After the second color filter material 283 is formed, the active layer 212 in the second sub-pixel area SP2 may be excited to emit light L. The light L emitted from the active layer 212 in the second sub-pixel area SP2 may pass through the second color conversion layer 254, and may be emitted to the second color filter material 283 within the opening area 235 of the second sub-pixel area SP2. Although a portion of blue light is converted to green light by the second color conversion layer 254, the second color filter material 283 may be cured by remaining blue light without being converted to green light.

Figure 24:
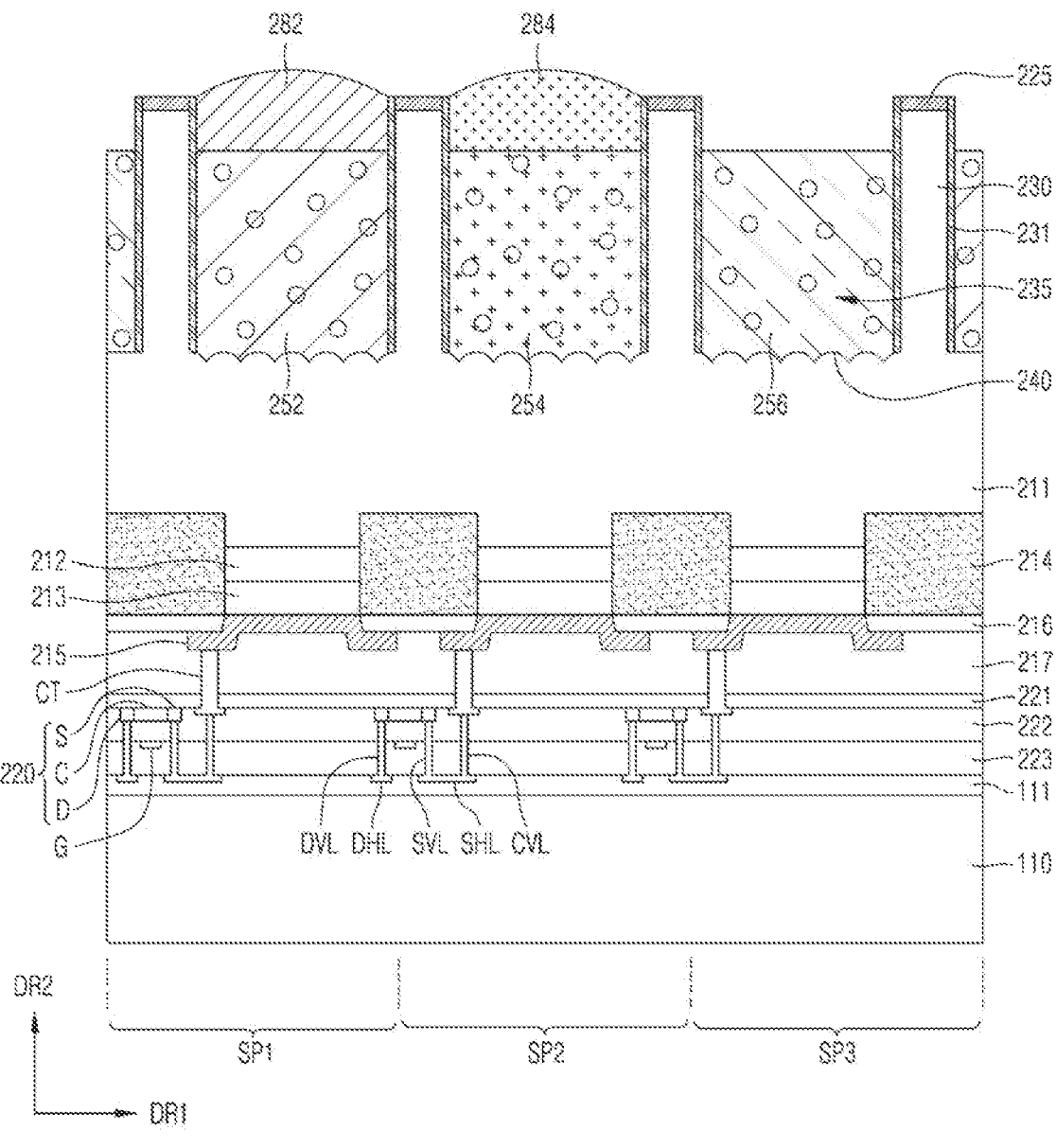

Referring to FIG. 24, an uncured portion of the second color filter material 283 is removed such that a second color filter 284 may be formed on the second color conversion layer 254 in the opening area 235 of the second sub-pixel area SP2. The second color conversion layer 254 and the second color filter 284 may be disposed together in the opening area 235 between the partitions 230. The second color filter 284 may be in direct contact with an upper surface of the corresponding second color conversion layer 254 under the second color filter 284. The thickness of the second color filter 284 may be selected such that the sum of the thickness of the second color conversion layer 254 and the thickness of the second color filter 284 is similar to the thickness of the partition 230. The second color filter 284 may be an absorption type color filter that transmits green light and absorbs red and blue light.

Figure 25:
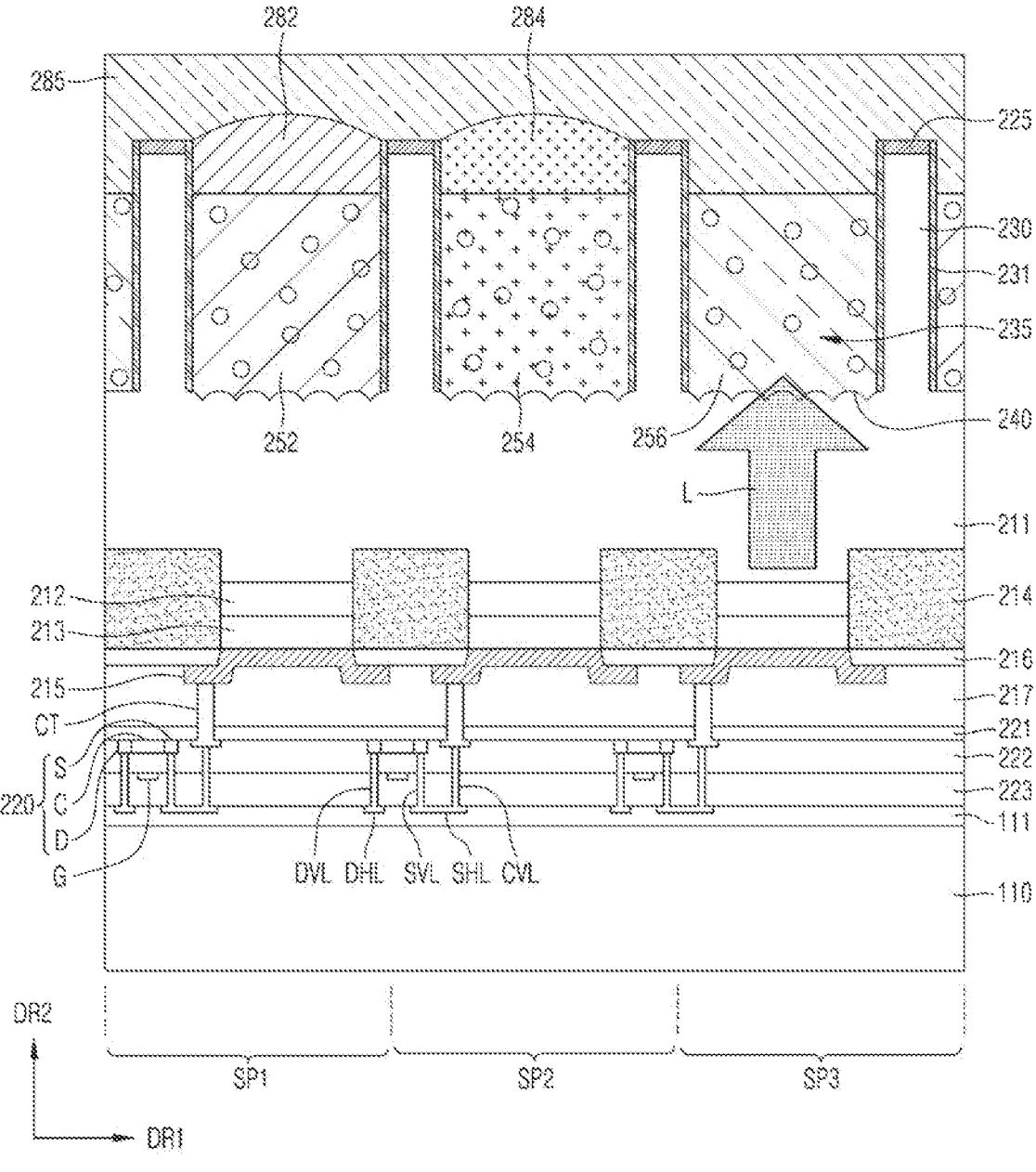

Referring to FIG. 25, a third color filter material 285 may be formed to cover all of the common electrode 225, the partition 230, the first color filter 282, the second color filter 284, and the third color conversion layer 256. The third color filter material 285 may comprise a blue dye or pigment that transmits blue light and absorbs red and green light, a photoresist, and a light scattering agent. The blue dye or pigment may be dispersed in the photoresist. After the third color filter material 285 is formed, the light L may be emitted by exciting the active layer 212 in the third sub-pixel area SP3. The light L emitted from the active layer 212 in the third sub-pixel area SP3 may pass through the third color conversion layer 256, and may be irradiated to the third color filter material 285 within the opening area 235 of the third sub-pixel area SP3. Accordingly, the third color filter material 285 may be cured.

Figure 26:
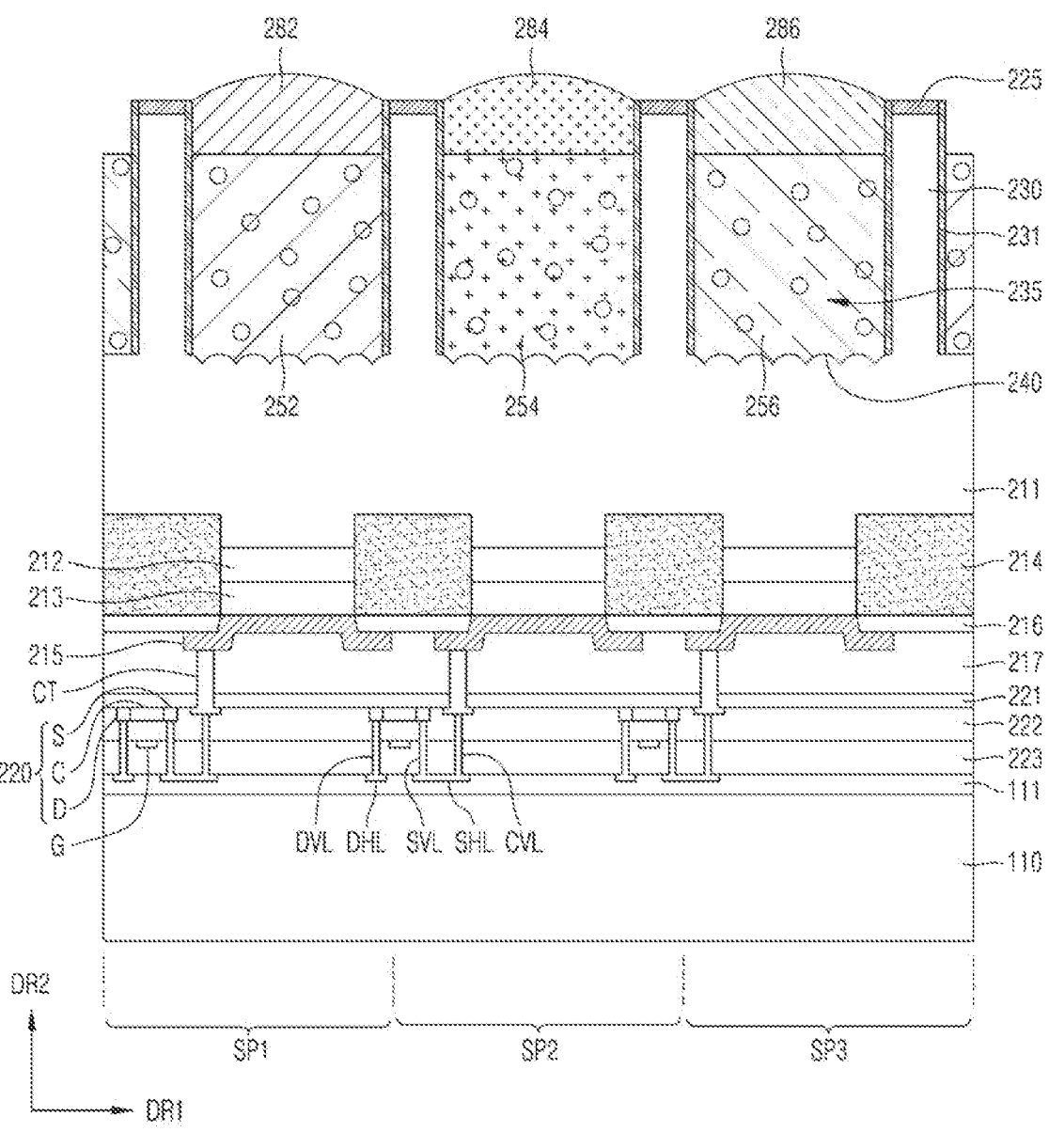

Referring to FIG. 26, an uncured portion of the third color filter material 285 is removed such that a third color filter 286 may be formed on the third color conversion layer 256 in the opening area 235 of the third sub-pixel area SP3. The third color conversion layer 256 and the third color filter 286 may be disposed together in the opening area 235 between the partitions 230. The third color filter 286 may be in direct contact with an upper surface of the corresponding second color conversion layer 256 under the third color filter 286. The thickness of the third color filter 286 may be selected such that the sum of the thickness of the third color conversion layer 256 and the thickness of the third color filter 286 is similar to the thickness of the partition 230. The third color filter 286 may be an absorption type color filter that transmits blue light and absorbs red and green light.

Figure 27:
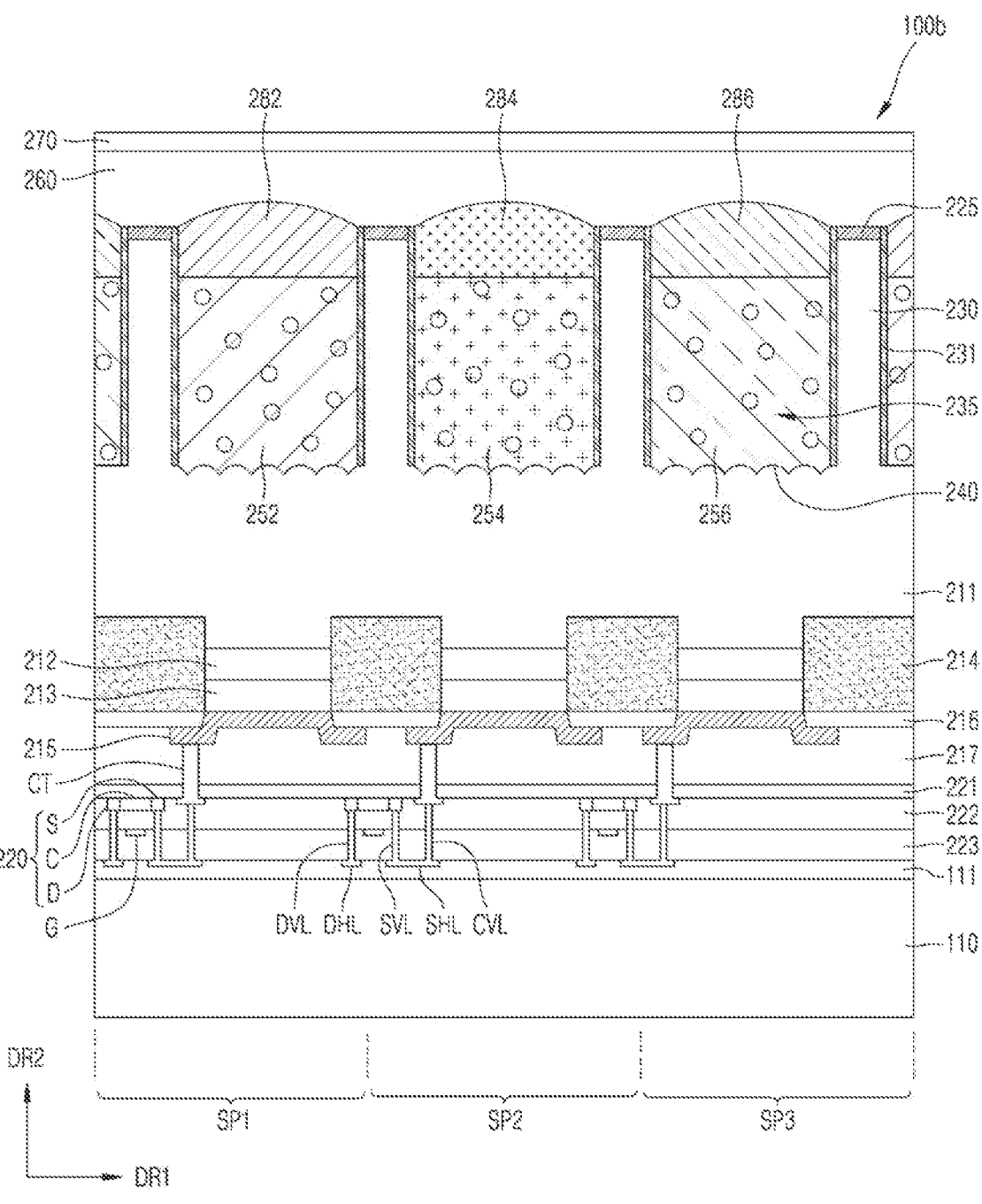

Referring to FIG. 27, a transparent fourth insulating layer 260 may be formed to cover the common electrode 225, the plurality of partitions 230, the first color filter 282, the second color filter 284, and the third color filter 286. In addition, a sealing layer 270 may be formed on the fourth insulating layer 260.

Through the above-described method, the display apparatus 100b according to the example embodiment may be manufactured. According to the above-mentioned manufacturing method, since the plurality of first to third color conversion layers 252, 254, and 256 and the plurality of first to third color filters 282, 284, and 286 may be patterned without a lithography process and a mask, it is possible to further reduce the manufacturing cost of the display apparatus 100b. In addition, color purity of the display apparatus 100b may be further improved by using the plurality of first to third color filters 282, 284, and 286.

When the color purity of blue light emitted from the active layer 212 is sufficiently high, the third color filter 286 may be omitted. For example, the display apparatus may comprise first to third color conversion layers 252, 254, and 256 and first and second color filters 282 and 284. According to another example embodiment, only the first and second color filters 282 and 284 may be further added in the example embodiment shown in FIG. 20. For example, the display apparatus may comprise first and second color conversion layers 252 and 254 and first and second color filters 282 and 284. According to yet another example embodiment, it is also possible to further form the first to third color filters 282, 284, and 286 in the example embodiment shown in FIG. 20. For example, the display apparatus may comprise first and second color conversion layers 252 and 254 and first to third color filters 282, 284, and 286.

Figure 28:
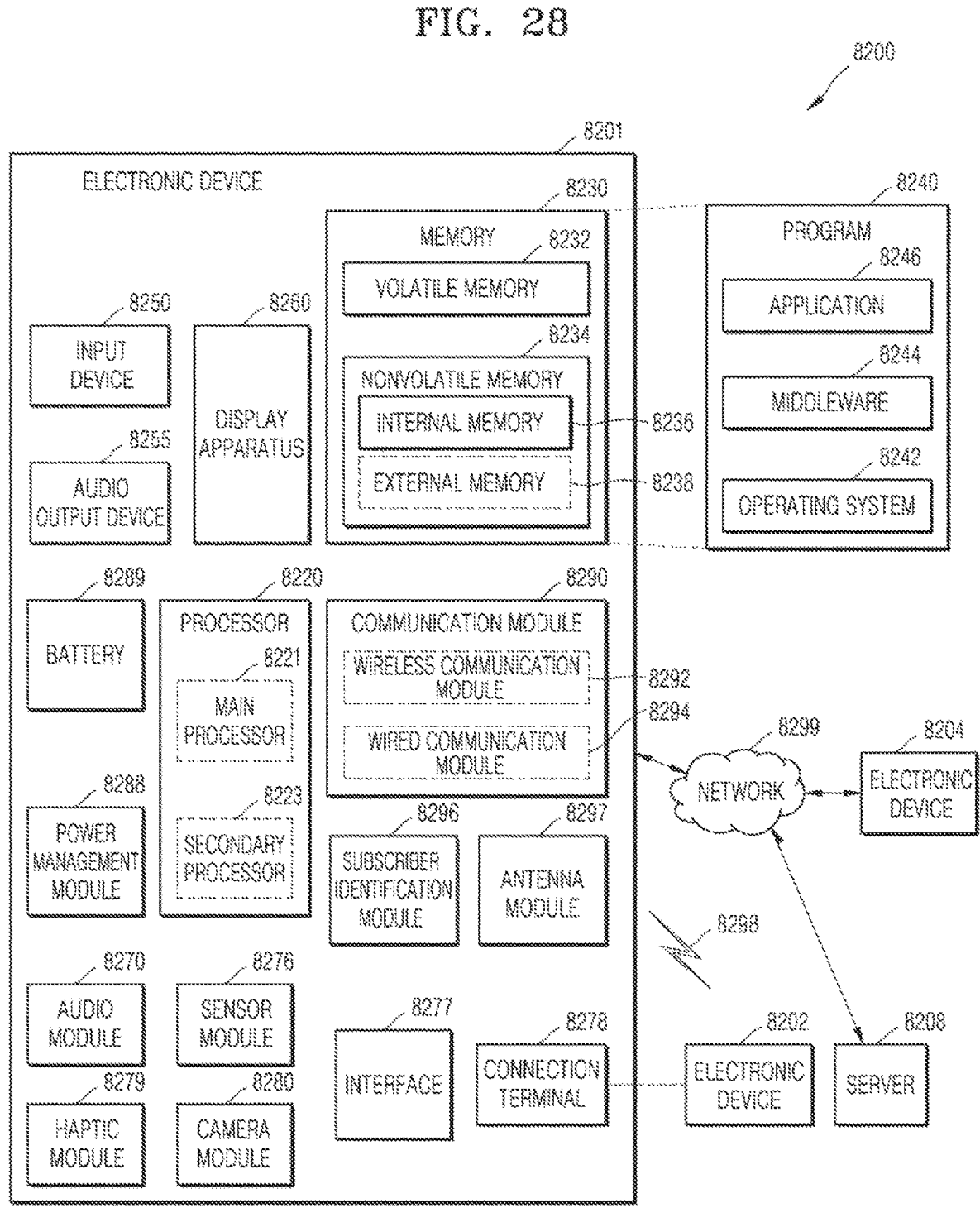
FIG. 28 is a block diagram of an electronic device according to an example embodiment.

The above-described display apparatuses may be applied to various electronic devices having a screen display function. FIG. 28 is a block diagram of an electronic device according to an example embodiment. Referring to FIG. 28, an electronic device 8200 may be provided in a network environment 8201. In the network environment 8200, the electronic device 8201 may communicate with another electronic device 8202 through a first network 8298 (such as a short-range wireless communication network, and the like), or communicate with another electronic device 8204 and/or a server 8208 through a second network 8299 (such as a remote wireless communication network). The electronic device 8201 may communicate with the electronic device 8204 through the server 8208. The electronic device 8201 may comprise a processor 8220, a memory 8230, an input device 8250, an audio output device 8255, a display device 8260, an audio module 8270, a sensor module 8276, and an interface 8277, a haptic module 8279, a camera module 8280, a power management module 8288, a battery 8289, a communication module 8290, a subscriber identification module 8296, and/or an antenna module 8297. In the electronic device 8201, some of these components may be omitted or other components may be added. Some of these components may be implemented as one integrated circuit. For example, the sensor module 8276 (fingerprint sensor, iris sensor, illuminance sensor, etc.) may be implemented by being embedded in the display apparatus 8260 (display, etc.).

The processor 8220 may execute software (the program 8240, etc.) to control one or a plurality of other components (such as hardware, software components, etc.) of the electronic device 8201 connected to the processor 8220, and perform various data processing or operations. As part of data processing or operation, the processor 8220 may load commands and/or data received from other components (the sensor module 8276, the communication module 8290, etc.) into the volatile memory 8232, process commands and/or data stored in the volatile memory 8232, and store result data in the nonvolatile memory 8234. The nonvolatile memory 8234 may comprise an internal memory 8236 mounted in the electronic device 8201 and a removable external memory 8238. The processor 8220 may comprise a main processor 8221 (such as a central processing unit, an application processor, etc.) and a secondary processor 8223 (such as a graphics processing unit, an image signal processor, a sensor hub processor, a communication processor, etc.) that may be operated independently or together. The secondary processor 8223 may use less power than the main processor 8221 and may perform specialized functions.

The secondary processor 8223 may control functions and/or states related to some of the components of the electronic device 8201 (such as the display apparatus 8260, the sensor module 8276, the communication module 8290, etc.) instead of the main processor 8221 while the main processor 8221 is in an inactive state (sleep state), or with the main processor 8221 while the main processor 8221 is in an active state (application execution state). The secondary processor 8223 (such as an image signal processor, a communication processor, etc.) may be implemented as part of other functionally related components (such as the camera module 8280, the communication module 8290, etc.).

The memory 8230 may store various data required by components of the electronic device 8201 (such as the processor 8220, the sensor module 8276, etc.). The data may comprise, for example, software (such as the program 8240, etc.) and input data and/or output data for commands related thereto. The memory 8230 may comprise a volatile memory 8232 and/or a nonvolatile memory 8234.

The program 8240 may be stored as software in the memory 8230 and may comprise an operating system 8242, a middleware 8244, and/or an application 8246.

The input device 8250 may receive commands and/or data to be used for components (such as the processor 8220, etc.) of the electronic device 8201 from outside (a user) of the electronic device 8201. The input device 8250 may comprise a remote controller, a microphone, a mouse, a keyboard, and/or a digital pen (such as a stylus pen).

The audio output device 8255 may output an audio signal to the outside of the electronic device 8201. The audio output device 8255 may comprise a speaker and/or a receiver. The speaker may be used for general purposes such as multimedia playback or recording playback, and the receiver may be used to receive incoming calls. The receiver may be combined as a part of the speaker or may be implemented as an independent separate device.

The display apparatus 8260 may visually provide information to the outside of the electronic device 8201. The display apparatus 8260 may comprise a display, a hologram device, or a projector and a control circuit for controlling the device. The display apparatus 8260 may be the display apparatus 100, 100a, or 100b having the above-described structure. The display apparatus 8260 may comprise a touch circuitry set to sense a touch, and/or a sensor circuit (such as a pressure sensor) set to measure the strength of a force generated by the touch.

The audio module 8270 may convert sound into an electrical signal, or conversely, may convert an electrical signal into sound. The audio module 8270 may acquire sound through the input device 8250 or output sound through speakers and/or headphones of the audio output device 8255, and/or other electronic devices (such as the electronic device 8202) directly or wirelessly connected to the electronic device 8201.

The sensor module 8276 may detect an operating state (such as power, temperature, and the like) of the electronic device 8201 or an external environmental state (such as a user state, and the like), and generate an electrical signal and/or data value corresponding to the detected state. The sensor module 8276 may comprise a gesture sensor, a gyro sensor, a barometric pressure sensor, a magnetic sensor, an acceleration sensor, a grip sensor, a proximity sensor, a color sensor, an infrared (IR) sensor, a biometric sensor, a temperature sensor, a humidity sensor, and/or an illuminance sensor.

The interface 8277 may support one or more specified protocols that may be used for the electronic device 8201 to connect directly or wirelessly with another electronic device (such as the electronic device 8202). The interface 8277 may comprise a High Definition Multimedia Interface (HDMI), a Universal Serial Bus (USB) interface, an SD card interface, and/or an audio interface.

The connection terminal 8278 may comprise a connector through which the electronic device 8201 may be physically connected to another electronic device (such as the electronic device 8202). The connection terminal 8278 may comprise an HDMI connector, a USB connector, an SD card connector, and/or an audio connector (such as a headphone connector).

The haptic module 8279 may convert an electrical signal into a mechanical stimulus (such as vibration, movement, etc.) or an electrical stimulus that a user may perceive through a tactile or motor sense. The haptic module 8279 may comprise a motor, a piezoelectric element, and/or an electrical stimulation device.

The camera module 8280 may capture a still image and a video. The camera module 8280 may comprise a lens assembly comprising one or more lenses, image sensors, image signal processors, and/or flashes. The lens assembly comprised in the camera module 8280 may collect light emitted from a subject that is a target of image capturing.

The power management module 8288 may manage power supplied to the electronic device 8201. The power management module 8288 may be implemented as a part of a power management integrated circuit (PMIC).

The battery 8289 may supply power to components of the electronic device 8201. The battery 8289 may comprise a non-rechargeable primary cell, a rechargeable secondary cell, and/or a fuel cell.

The communication module 8290 may support establishing a direct (wired) communication channel and/or a wireless communication channel, and performing communication through the established communication channel between the electronic device 8201 and other electronic devices (such as the electronic device 8202, the electronic device 8204, the server 8208, and the like). The communication module 8290 may comprise one or more communication processors that operate independently of the processor 8220 (such as an application processor) and support direct communication and/or wireless communication. The communication module 8290 may comprise a wireless communication module 8292 (such as a cellular communication module, a short-range wireless communication module, a Global Navigation Satellite System (GNSS) communication module, and the like) and/or a wired communication module 8294 (such as a local area network (LAN) communication module, a power line communication module, and the like). Among these communication modules, a corresponding communication module may communicate with other electronic devices through a first network 8298 (a short-range communication network such as Bluetooth, WiFi Direct, or Infrared Data Association (IrDA)) or a second network 8299 (a cellular network, the Internet, or a telecommunication network such as a computer network (such as LAN, WAN, and the like)). These various types of communication modules may be integrated into one component (such as a single chip, and the like), or may be implemented as a plurality of separate components (a plurality of chips). The wireless communication module 8292 may check and authenticate the electronic device 8201 in a communication network such as the first network 8298 and/or the second network 8299 using the subscriber information (such as international mobile subscriber identifier (IMSI), etc.) stored in the subscriber identification module 8296.

The antenna module 8297 may transmit signals and/or power to the outside (such as other electronic devices) or receive signals and/or power from the outside. The antenna may comprise a radiator made of a conductive pattern formed on a substrate (such as PCB, etc.). The antenna module 8297 may comprise one or a plurality of antennas. If multiple antennas are comprised, an antenna suitable for a communication method used in a communication network such as the first network 8298 and/or the second network 8299 may be selected from the plurality of antennas by the communication module 8290. Signals and/or power may be transmitted or received between the communication module 8290 and another electronic device through the selected antenna. In addition to the antenna, other components (such as RFIC) may be comprised as part of the antenna module 8297.

Some of the components are connected to each other and may exchange signals (such as commands, data, and the like) through communication method between peripheral devices (such as bus, general purpose input and output (GPIO), serial peripheral interface (SPI), mobile industry processor interface (MIPI), and the like).

The command or data may be transmitted or received between the electronic device 8201 and the external electronic device 8204 through the server 8208 connected to the second network 8299. The other electronic devices 8202 and 8204 may be the same or different types of devices as or from the electronic device 8201. All or some of the operations executed by the electronic device 8201 may be executed by one or more of the other electronic devices 8202, 8204, and 8208. For example, when the electronic device 8201 needs to perform a certain function or service, instead of executing the function or service itself, the electronic device 8201 may request one or more other electronic devices to perform the function or part or all of the service. One or more other electronic devices that receive the request may execute an additional function or service related to the request, and transmit a result of the execution to the electronic device 8201. For this, cloud computing, distributed computing, and/or client-server computing technology may be used.

Figure 29:
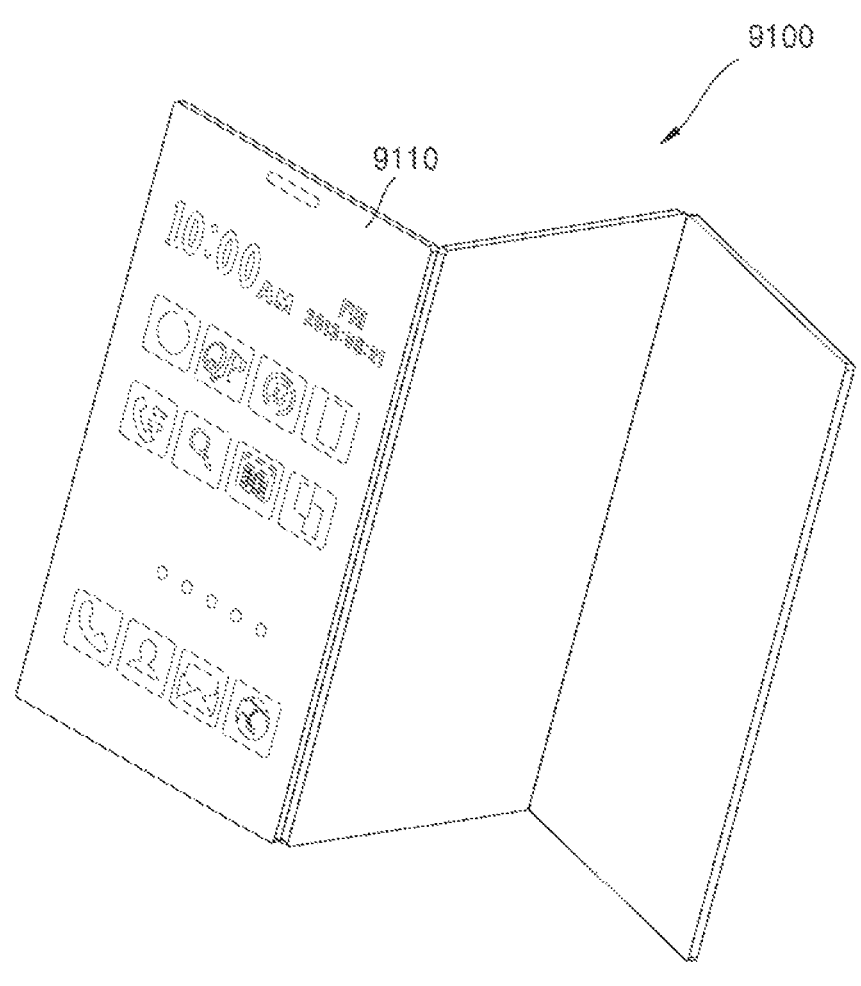
FIG. 29 illustrates an example in which a display apparatus according to example embodiments is applied to a mobile device.

FIG. 29 illustrates an example in which a display apparatus according to example embodiments is applied to a mobile device. The mobile device 9100 may comprise a display apparatus 9110, and the display apparatus 911 may be the display apparatuses 100, 100a, and 100b having the above-described structure. The display apparatus 9110 may have a foldable structure, for example, a multi-foldable structure.

Figure 30:
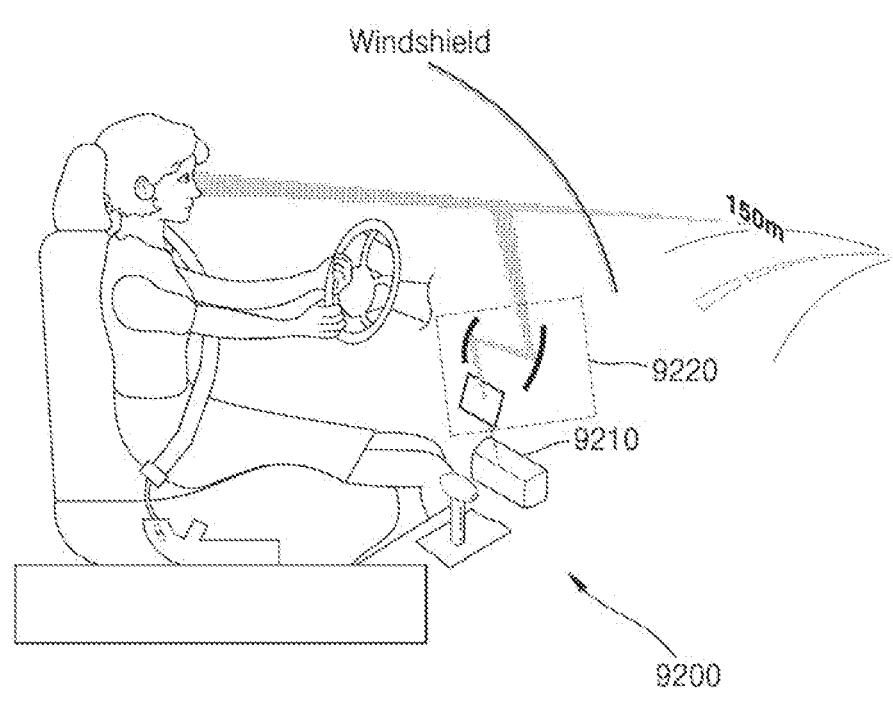
FIG. 30 illustrates an example in which the display apparatus according to the example embodiments is applied to a vehicle display apparatus.

FIG. 30 illustrates an example in which the display apparatus according to the example embodiments is applied to a vehicle display apparatus. The display apparatus may be a vehicle head-up display apparatus 9200, and may comprise a display 9210 provided in an area of the vehicle, and a light path changing member 9220 that converts an optical path so that the driver may see the image generated on the display 9210.

Figure 31:
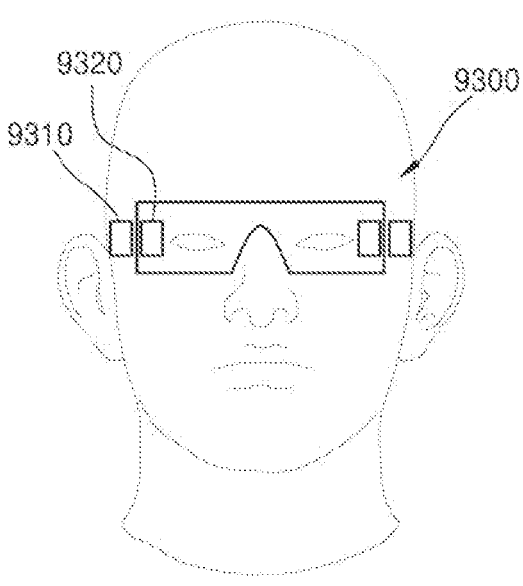
FIG. 31 illustrates an example in which the display apparatus according to the example embodiments is applied to augmented reality glasses or virtual reality glasses.

FIG. 31 illustrates an example in which a display apparatus according to example embodiments is applied to augmented reality glasses or virtual reality glasses. Augmented reality device 9300 having the form of glasses may comprise a projection system 9310 comprising a display apparatus for forming an image, and an optical system 9320 for guiding the image from the projection system 9310 into the user's eye. The projection system 9310 may comprise the display apparatuses 100, 100a, and 100b having the above-described structure.

Figure 32:
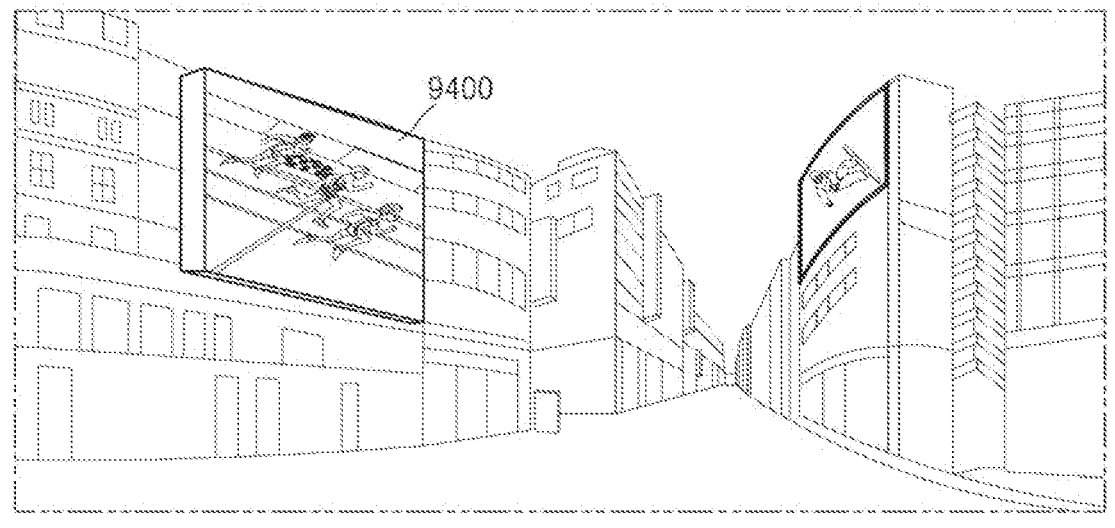
FIG. 32 shows an example in which the display apparatus according to the example embodiments is applied to a signage.

FIG. 32 shows an example in which the display apparatus according to the example embodiments is applied to a signage. A signage 9400 may be used for outdoor advertisement using a digital information display, and may control advertisement contents and the like through a communication network. The signage 9400 may be implemented, for example, through the electronic device described with reference to FIG. 28.

Figure 33:
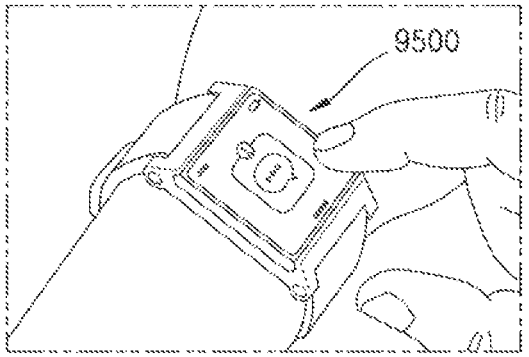
FIG. 33 illustrates an example in which the display apparatus according to the example embodiments is applied to a wearable display.

FIG. 33 illustrates an example in which a display apparatus according to example embodiments is applied to a wearable display. The wearable display 9500 may be the display apparatus 100, 100a, 100b having the above-described structure, and may be implemented through the electronic device described with reference to FIG. 28.

The display apparatus according to the example embodiment may also be applied to various products such as a rollable TV and a stretchable display.

It should be understood that example embodiments described herein should be considered in a descriptive sense only and not for purposes of limitation. Descriptions of features or aspects within each example embodiment should typically be considered as available for other similar features or aspects in other embodiments. While example embodiments have been described with reference to the figures, it will be understood by those of ordinary skill in the art that various changes in form and details may be made therein without departing from the spirit and scope as defined by the following claims, and their equivalents.

What is claimed is:

1. A display apparatus comprising:
a first semiconductor layer having a first surface and a second surface opposite to the first surface, a plurality of partitions protruding from the first surface to a level of an upper surface of each partition of the plurality of partitions, and a plurality of opening areas between the plurality of partitions;
a plurality of active layers provided opposite to the plurality of opening areas on the second surface of the first semiconductor layer;
a plurality of second semiconductor layers respectively provided on the plurality of active layers opposite to the first semiconductor layer;
a plurality of separation films, each separation film of the plurality of separation films being provided between two adjacent active layers among the plurality of active layers and between two adjacent second semiconductor layers among the plurality of second semiconductor layers;
a plurality of color conversion layers provided in the plurality of opening areas on the first surface of the first semiconductor layer;
a plurality of common electrodes comprising a conductive metal material, each common electrode of the plurality of common electrodes being provided only on the upper surface of each corresponding partition of the plurality of partitions;
a light blocking film provided on sidewalls of the plurality of partitions; and
a driving circuit configured to independently drive the plurality of active layers,
wherein a material composition of the plurality of partitions is the same as a material composition of the first semiconductor layer,
wherein the plurality of partitions integrally extend from the first surface of the first semiconductor layer opposite to the plurality of active layers and the plurality of separation films, and
wherein the first semiconductor layer is a single layer continuously extending on upper surfaces of the plurality of active layers and upper surfaces of the plurality of separation films.

2. The display apparatus of claim 1, wherein the common electrode comprises an opaque metal material.

3. The display apparatus of claim 1, further comprising a support substrate and a driving circuit layer provided between the support substrate and the plurality of second semiconductor layers and between the support substrate and the separation film,
wherein the driving circuit layer comprises the driving circuit.

4. The display apparatus of claim 1, wherein the first surface of the first semiconductor layer in the plurality of opening areas has a light extraction pattern.

5. The display apparatus of claim 1, further comprising a plurality of reflective electrodes electrically connected to the plurality of second semiconductor layers, respectively.

6. The display apparatus of claim 1, wherein the first semiconductor layer is doped with a first conductivity type, and the plurality of second semiconductor layers are doped with a second conductivity type electrically opposite to the first conductivity type.

7. The display apparatus of claim 1, wherein an interval between two adjacent partitions, among the plurality of partitions, is greater than a width of each of the plurality of active layers.

8. The display apparatus of claim 7, wherein the width of each of the plurality of active layers is in a range of 0.1 μm to 100 μm.

9. The display apparatus of claim 1, wherein a height of each of the plurality of color conversion layers is less than a height of each of the plurality of partitions.

10. The display apparatus of claim 1, wherein each of the plurality of color conversion layers comprises a photoresist and quantum dots or phosphors dispersed in the photoresist.

11. The display apparatus of claim 1, further comprising an insulating layer provided on the plurality of partitions and the plurality of color conversion layers, the insulating layer having transparency to light emitted from the plurality of color conversion layers.

12. The display apparatus of claim 1, further comprising a plurality of absorption type color filters respectively provided on the plurality of color conversion layers.

13. The display apparatus of claim 12, wherein each of the plurality of absorption type color filters is provided in direct contact with an upper surface of a corresponding one of the plurality of color conversion layers.

14. A display apparatus comprising:
a first semiconductor layer having a first surface and a second surface opposite to each other, a plurality of partitions protruding from the first surface to a level of an upper surface of each partition of the plurality of partitions, and a plurality of opening areas between the plurality of partitions;
a plurality of active layers provided opposite to the plurality of opening areas on the second surface of the first semiconductor layer;
a plurality of second semiconductor layers respectively provided on the plurality of active layers opposite to the first semiconductor layer;
a plurality of separation films, each separation film of the plurality of separation films being provided between two adjacent active layers among the plurality of active layers and between two adjacent second semiconductor layers among the plurality of second semiconductor layers;
a plurality of color conversion layers provided in the plurality of opening areas on the first surface of the first semiconductor layer;
a plurality of common electrodes comprising a conductive metal material, each common electrode of the plurality of common electrodes being provided only on the upper surface of each corresponding partition of the plurality of partitions;
a light blocking film provided on sidewalls of the plurality of partitions; and
a driving circuit configured to independently drive the plurality of active layers, wherein the plurality of partitions integrally extend from the first surface of the first semiconductor layer opposite to the plurality of active layers and the plurality of separation films, wherein the first semiconductor layer is a single layer continuously extending on upper surfaces of the plurality of active layers and upper surfaces of the plurality of separation films.

* * * * *